(12) United States Patent
Heinrich et al.

(10) Patent No.: US 11,552,042 B2
(45) Date of Patent: Jan. 10, 2023

(54) SOLDER MATERIAL WITH TWO DIFFERENT SIZE NICKEL PARTICLES

(71) Applicant: Infineon Technologies AG, Neubiberg (DE)

(72) Inventors: Alexander Heinrich, Bad Abbach (DE); Alexander Roth, Zeitlarn (DE); Catharina Wille, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 90 days.

(21) Appl. No.: 17/118,008

(22) Filed: Dec. 10, 2020

(65) Prior Publication Data

US 2021/0183804 A1 Jun. 17, 2021

(30) Foreign Application Priority Data

Dec. 11, 2019 (DE) .......................... 102019134000.4
Nov. 19, 2020 (DE) .......................... 102020130638.5

(51) Int. Cl.
*H01L 23/48* (2006.01)
*H01L 21/00* (2006.01)
(Continued)

(52) U.S. Cl.
CPC .............. *H01L 24/29* (2013.01); *B22F 1/052* (2022.01); *B23K 35/0227* (2013.01); *B23K 35/0244* (2013.01); *B23K 35/3033* (2013.01); *H01L 21/56* (2013.01); *H01L 23/3121* (2013.01); *H01L 23/49582* (2013.01); *H01L 24/27* (2013.01); *B22F 2301/15* (2013.01); *B22F 2304/10* (2013.01); *B23K 2101/40* (2018.08); *H01L 2224/2746* (2013.01); *H01L 2224/29111* (2013.01); *H01L 2224/29118* (2013.01);
(Continued)

(58) Field of Classification Search
CPC ......... H01L 24/29; H01L 24/27; H01L 21/56; H01L 23/49582; B22F 1/052; B23K 35/0227; B23K 35/0244; B23K 35/3033
See application file for complete search history.

(56) References Cited

U.S. PATENT DOCUMENTS 6,576,334 B2* 6/2003 Sakairi ................ H01L 21/2007
428/323
2002/0173145 A1* 11/2002 Honda .................... H01L 24/29
438/654

(Continued)

*Primary Examiner* — Alonzo Chambliss
(74) *Attorney, Agent, or Firm* — Murphy, Bilak & Homiller, PLLC

(57) ABSTRACT

A solder material may include nickel and tin. The nickel may include first and second amounts of particles. A sum of the particle amounts is a total amount of nickel or less. The first amount is between 5 at % and 60 at % of the total amount of nickel. The second amount is between 10 at % and 95 at % of the total amount of nickel. The particles of the first amount have a first size distribution, the particles of the second amount have a second size distribution, 30% to 70% of the first amount have a particle size in a range of about 5 μm around a particle size the highest number of particles have according to the first size distribution, and 30% to 70% of the second amount have a particle size in a range of about 5 μm around a particle size the highest number of particles have according to the second size distribution.

17 Claims, 14 Drawing Sheets

(51) Int. Cl.
  H01L 23/00       (2006.01)
  B23K 35/30       (2006.01)
  B23K 35/02       (2006.01)
  H01L 23/495      (2006.01)
  H01L 23/31       (2006.01)
  H01L 21/56       (2006.01)
  B22F 1/052       (2022.01)
  B23K 101/40      (2006.01)

(52) U.S. Cl.
  CPC ............... *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29169* (2013.01)

(56) References Cited

U.S. PATENT DOCUMENTS

2009/0226701 A1*  9/2009  Carbone ............... C09K 5/14
                                                        428/317.1
2013/0233618 A1*  9/2013  Nakano ............... B22F 7/064
                                                        228/101
2016/0129530 A1*  5/2016  Greve ............... B23K 35/262
                                                        75/228

* cited by examiner

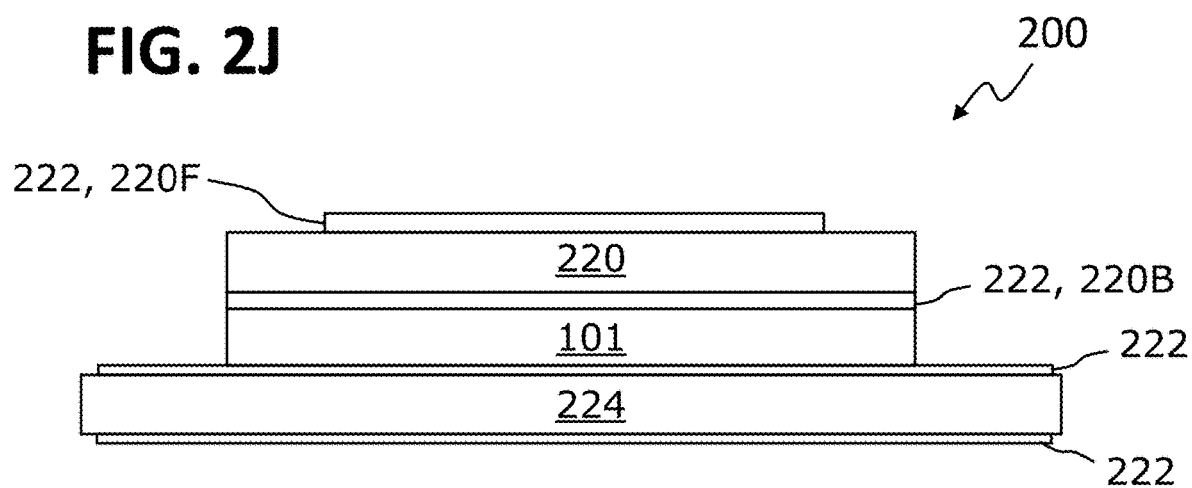

SOLDER MATERIAL WITH TWO DIFFERENT SIZE NICKEL PARTICLES

TECHNICAL FIELD

Various embodiments relate generally to a solder material, to a layer structure, to a chip package, to a method of forming a layer structure, to a method of forming a chip package, to a chip arrangement, and to a method of forming a chip arrangement.

BACKGROUND

For power applications, dies and clips are today soldered with a high lead (Pb) based soft solder paste. Since, however, an EU-wide ban of lead is under way (see, e.g., RoHS, ELV rules), an alternative die- and clip-attach system may need to be developed to be as least as good as the paste system based on a high lead content.

Furthermore, at present, a so-called second level mounting, which may refer to a mounting of (e.g. power) chips onto a printed circuit board (PCB) is done using either eutectic PbSn solder with a melting temperature of roughly 180° C., or SAC solder with a melting temperature of roughly 220° C. These solders have several disadvantages that may limit a reliability of the resulting overall system: The board level interconnects formed by the solder may re-melt during an application at the given melting temperature, and/or may be prone to fatigue due to the relatively soft material, especially at elevated temperatures, and the eutectic PbSn solder is not Pb-free.

At present, there is no general replacement available for a solder that has a high lead content. Potential alternative solutions are only designed to address single applications. They are unsuitable for a general-purpose use.

For example, AuSn may not generally be used as a replacement for Pb-soldering due to significantly higher costs and tighter design rules/geometric restrictions.

Thin dies may be a challenge for a couple of potential solutions, especially for those without melting materials. Other potential alternative solutions may have too low a melting point, which may be an issue during second level soldering (for this, a minimum melting temperature of 270° C. may be required).

Adhesives with a filling with a high silver content as a potential solution may show worse thermal and electrical performance compared to the solder with the high lead content.

Other high performance solutions may not be cost competitive.

SUMMARY

A solder material is provided. The solder material may include nickel and tin, wherein the nickel may include a first amount of particles and a second amount of particles, wherein a sum of the first amount of particles and the second amount of particles is a total amount of the nickel or less, wherein the first amount of particles is between 5 at % and 60 at % of the total amount of the nickel, wherein the second amount of particles is between 10 at % and 95 at % of the total amount of the nickel, wherein the particles of the first amount of particles have a first size distribution, wherein the particles of the second amount of particles have a second size distribution, wherein 30% to 70% of the first amount of particles have a particle size that is in a range of about 5 µm around a particle size the highest number of particles have according to the first size distribution, and wherein 30% to 70% of the second amount of particles have a particle size that is in a range of about 5 µm around a particle size the highest number of particles have according to the second size distribution.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

each of FIG. 1A to FIG. 1C shows an illustration if a solder material in accordance with various embodiments.

Figure 3A:
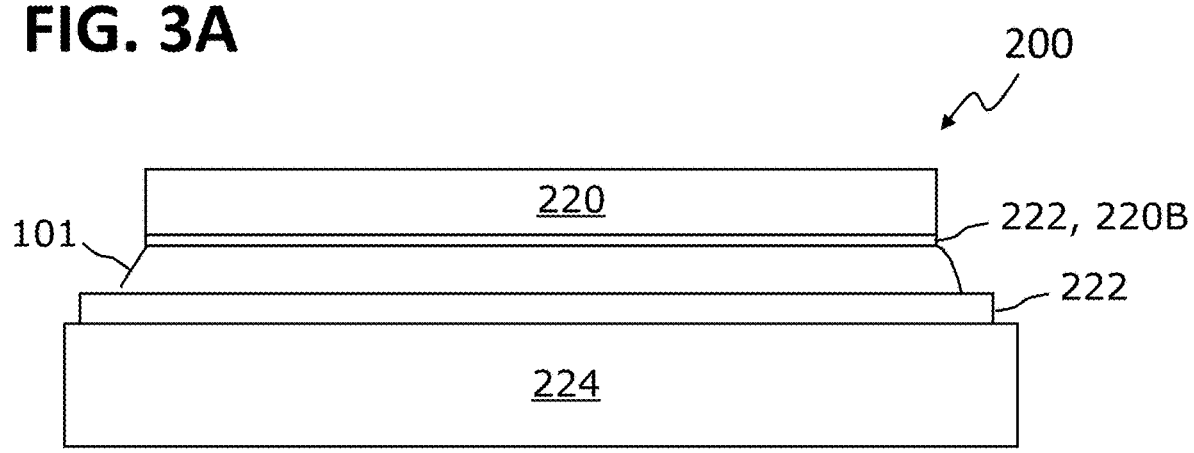
Figure 3B:
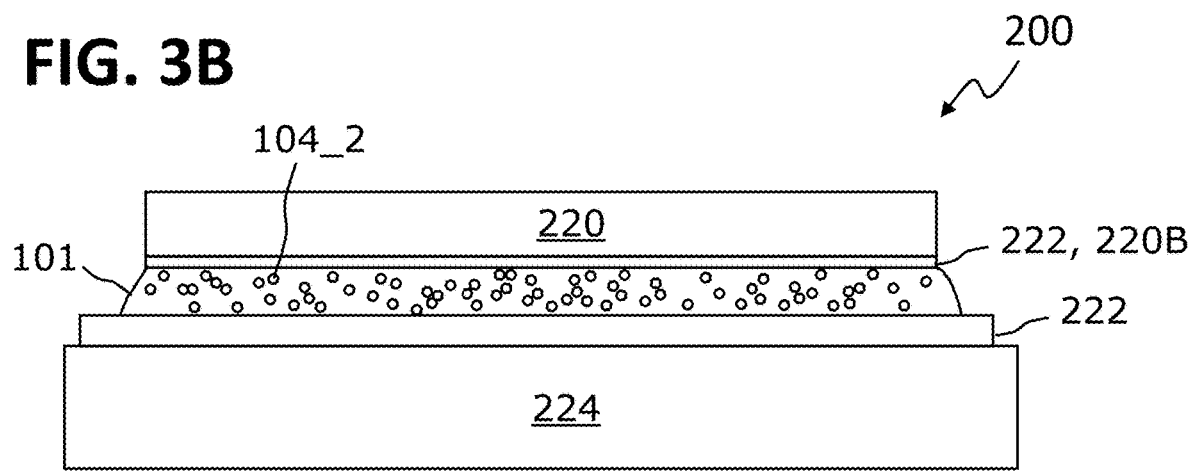
Figure 4A:
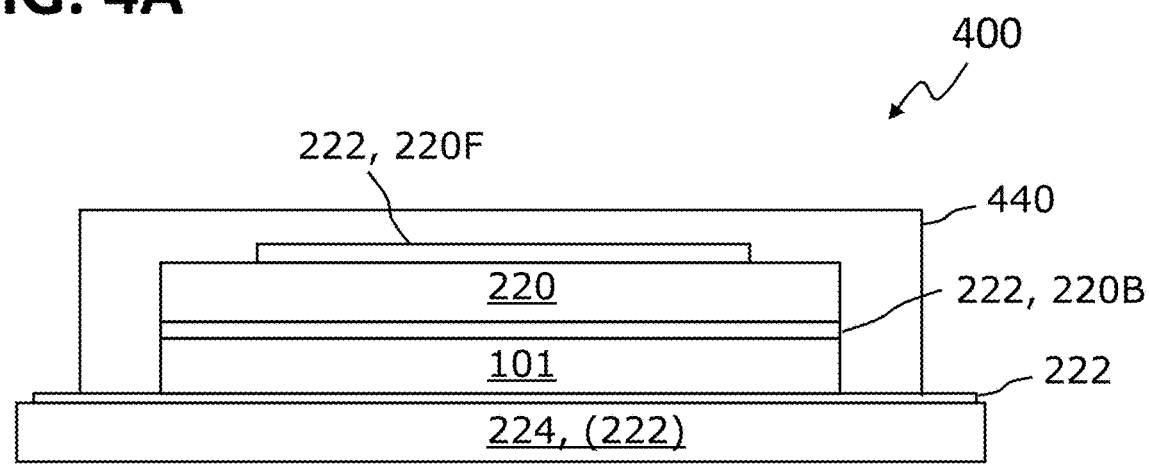
Figure 4B:
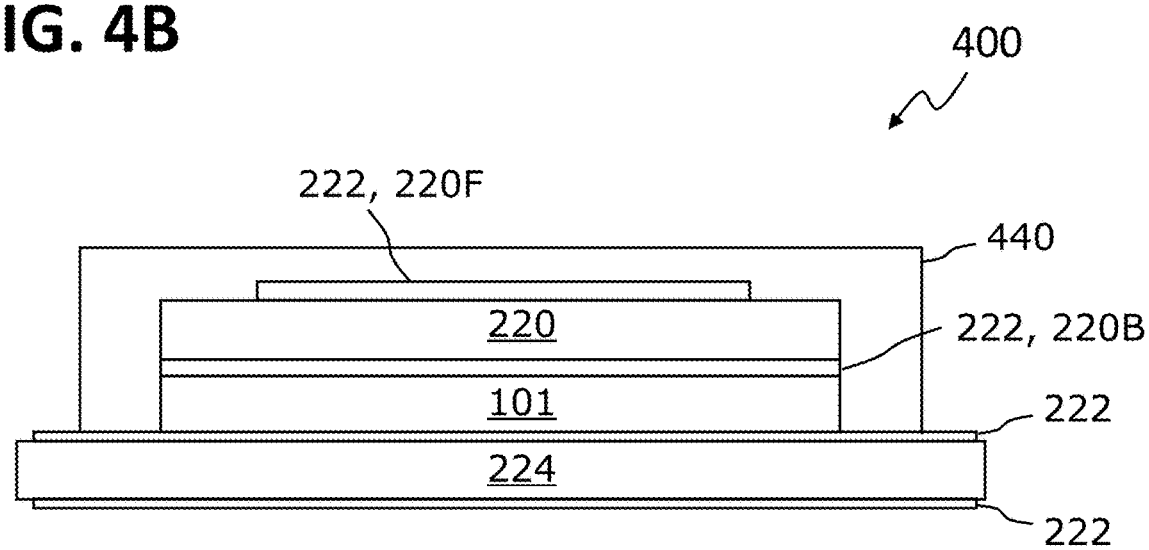
Figure 5A:
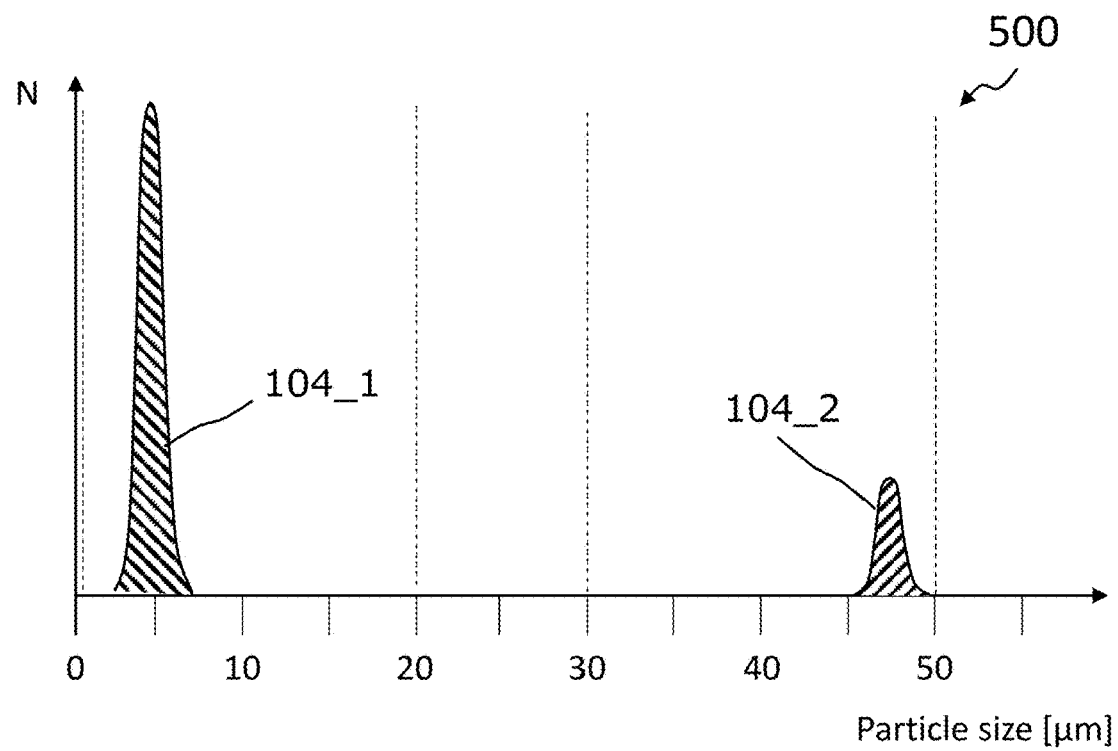
Figure 5B:
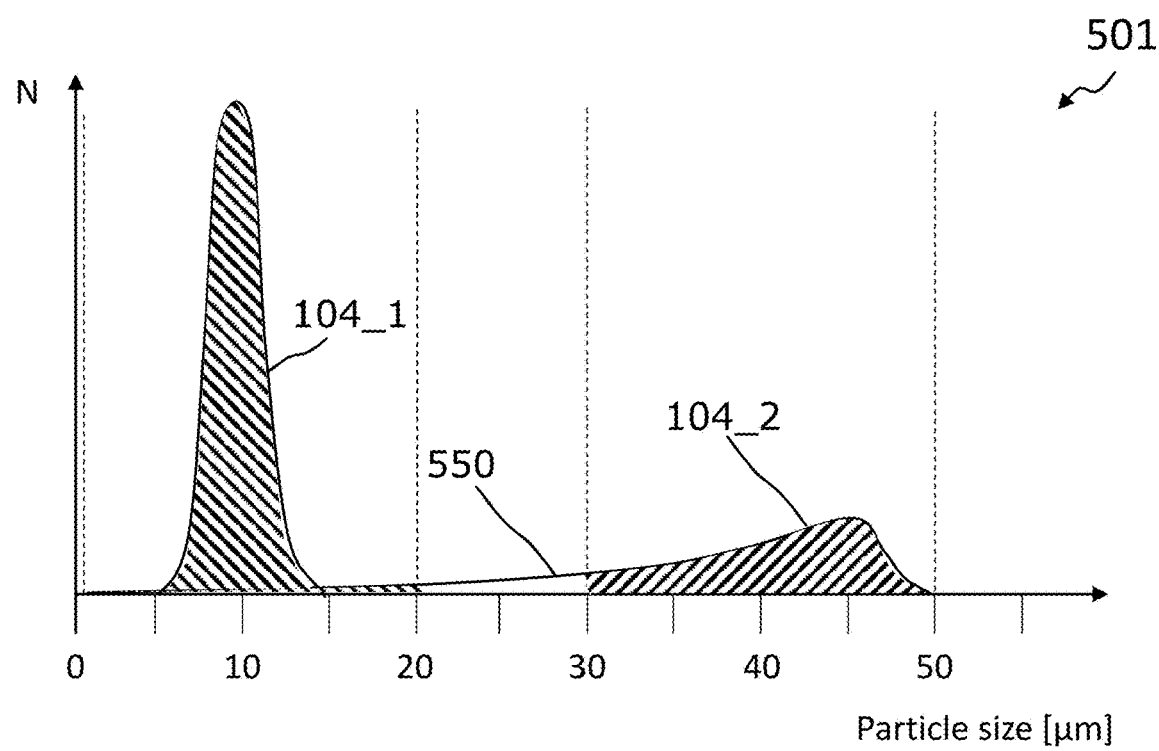
Figure 6:
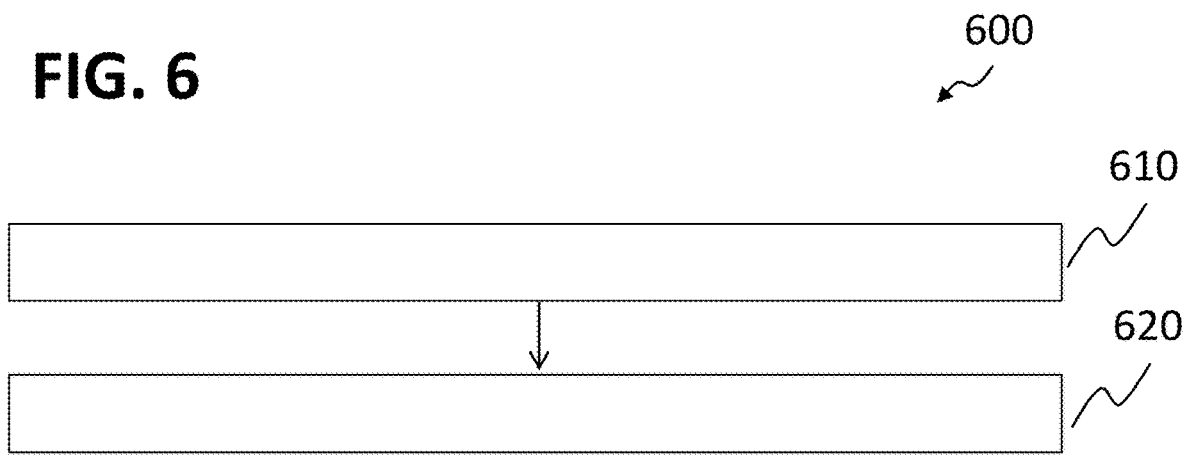
Figure 7:
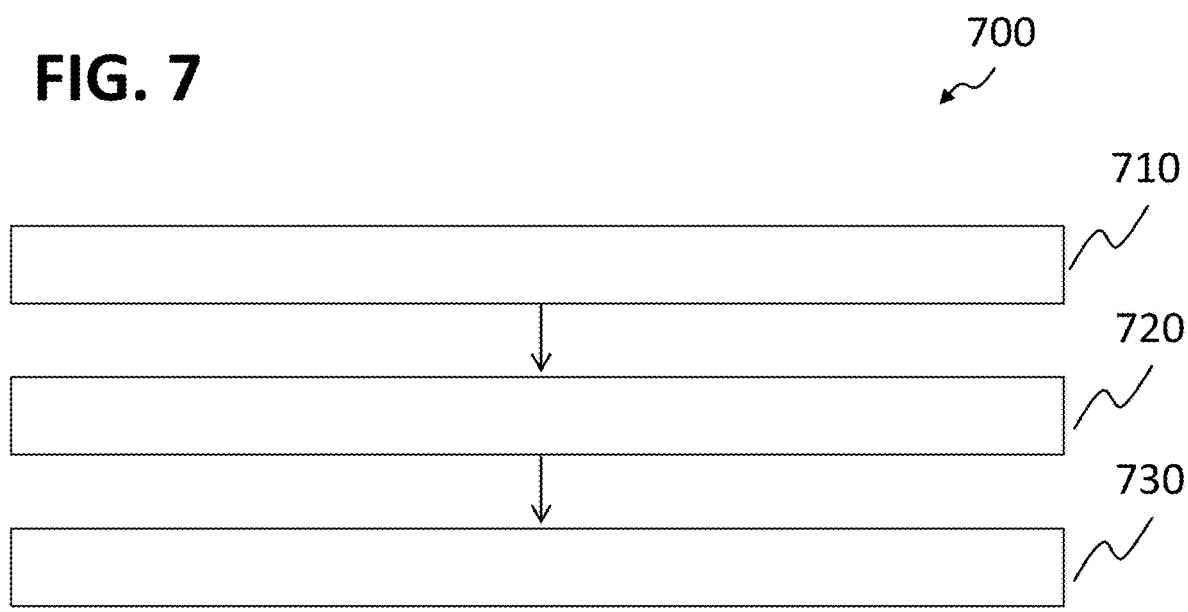
Figure 8:
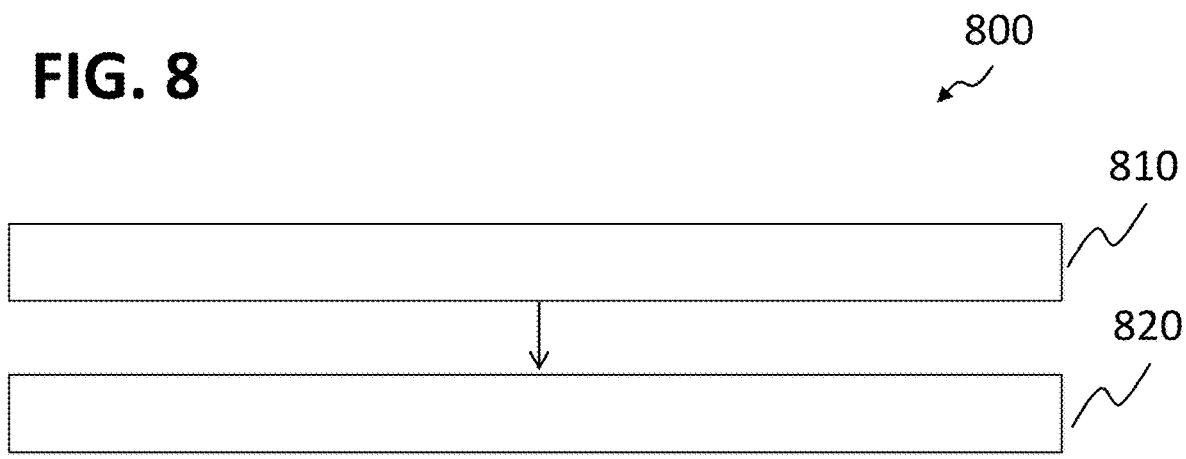
Figure 9:
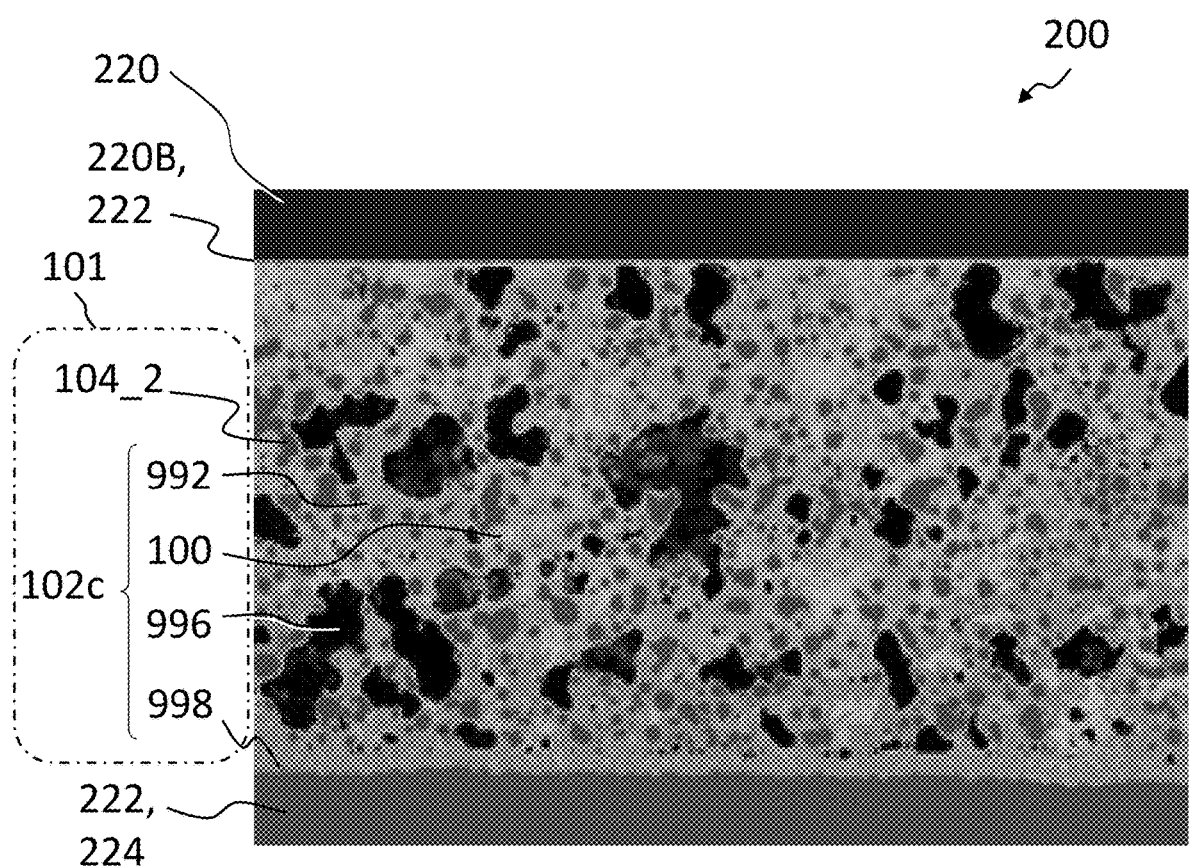
Figure 10A:
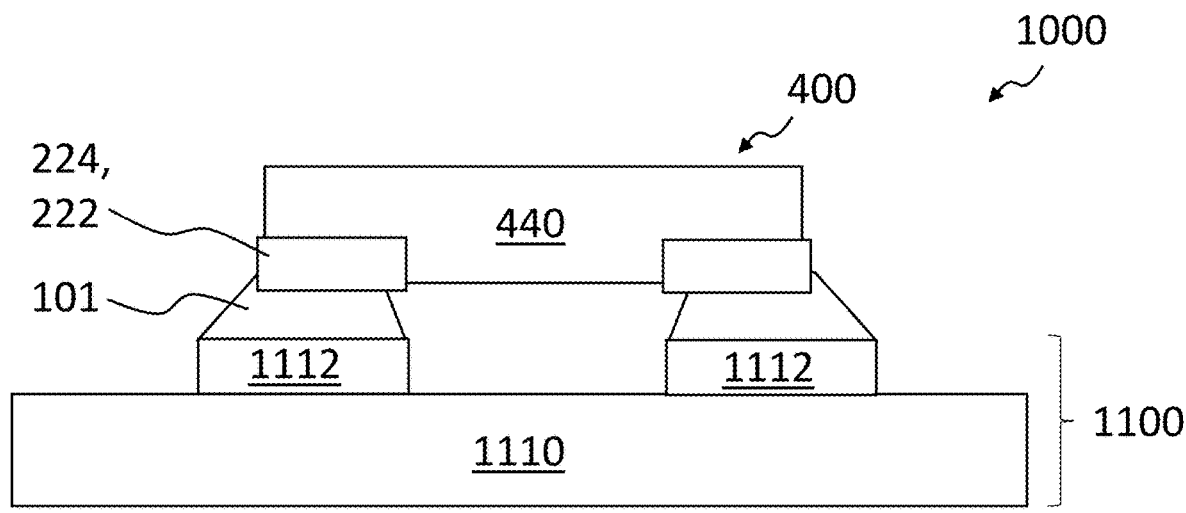
Figure 10B:
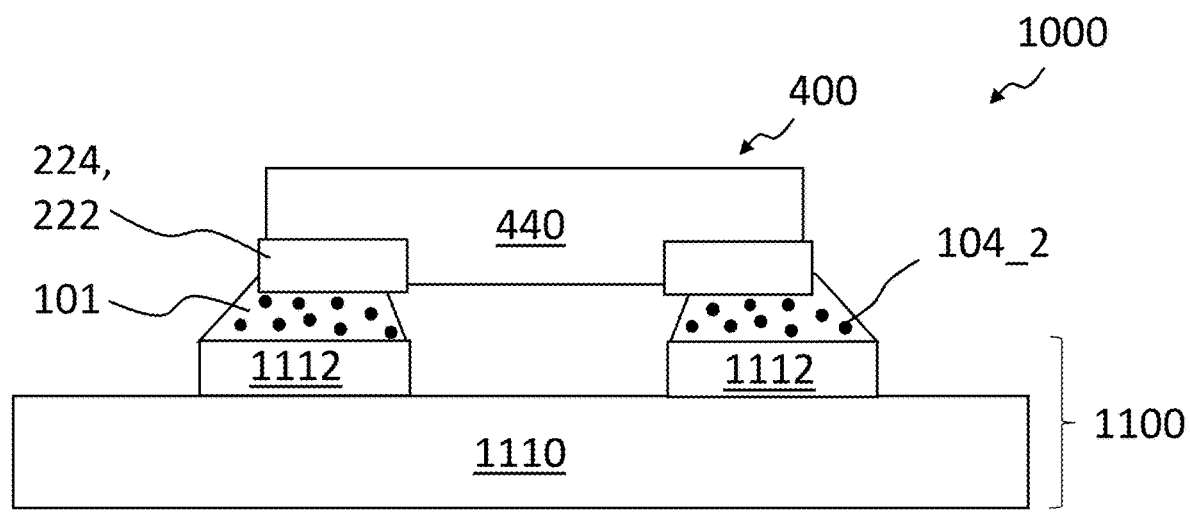

each of FIG. 2A to FIG. 2J shows a schematic cross-sectional view of a layer structure in accordance with various embodiments;

each of FIG. 3A and FIG. 3B shows a schematic cross-sectional view of a layer structure in accordance with various embodiments;

each of FIG. 4A and FIG. 4B shows a schematic cross-sectional view of a chip package in accordance with various embodiments;

each of FIG. 5A and FIG. 5B shows particle distributions of a first amount of particles and of a second amount of particles in a solder material in accordance with various embodiments;

FIG. 6 shows a flow diagram of a method of forming a layer structure in accordance with various embodiments; and FIG. 7 shows a flow diagram of a method of forming a chip package in accordance with various embodiments;

FIG. 8 shows a flow diagram of a method of forming a chip arrangement;

FIG. 9 shows a microscope image of a surface of a vertically cut layer structure in accordance with various embodiments; and each of FIGS. 10A and 10B shows a schematic cross-sectional view of a chip arrangement in accordance with various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a solder material is provided that may be used as a drop-in replacement for solder paste systems having a high lead content (also referred to as "high-lead solders").

In various embodiments, the solder material may include or consist of tin and nickel. A high nickel content of the solder material, e.g. a solder paste, may be realized by a bimodal distribution of nickel particles. The bimodal distribution may include a first amount of nickel particles having a relatively small size, e.g. in a range from about 0.5 µm to about 20 µm, e.g. from about 1 µm to about 20 µm, and a second amount of nickel particles having a larger size, e.g. in a range from about 30 µm to about 50 µm. In other words, the first amount of particles may have sizes that lie within a first size distribution, and the second amount of particles may have sizes that lie within a second size distribution. The particles having the relatively small size may also be referred to as the small-sized particles or as the small particles, and the particles having the relatively large size may also be referred to as the large particles, the large-sized particles or the big particles.

In various embodiments, 30% to 70% (optionally 40% to 60%) of the first amount of particles may have a particle size that is in a range of about 5 µm around a particle size the highest number of particles have according to the first size distribution. In other words, most or at least a large fraction of the small particles may have a most frequent size or a size close to the most frequent size, e.g. about ±2.5 µm around the most frequent size.

In various embodiments, 30% to 70% (optionally 40% to 60%) of the second amount of particles may have a particle size that is in a range of about 5 µm around a particle size the highest number of particles have according to the second size distribution. In other words, most or at least a large fraction of the large particles may have a most frequent size or a size close to the most frequent size, e.g. about ±2.5 µm around the most frequent size.

In various embodiments, the first size distribution and the second size distribution may have essentially no overlap.

During the soldering, the small particles may be completely alloyed with the tin-rich solder base material surrounding them, e.g. a tin-based soft solder, without being directly converted to the high-melting intermetallic phase (IMC). The tin-rich material, e.g., the tin-rich solder base material, may be understood to consist predominantly of tin, in other words, more than 50% of the weight of the solder may be formed by tin. The tin-rich material may be free of lead.

The tin-rich material, some of which are commonly used in semiconductor industries, may for example include or consist of so-called SAC solder including 3-4% Ag, 0.5-0.7% Cu, the remainder may be Sn (all percentages in this paragraph may be weight percentages), SnSb solder including 5-25% Sb, SnAg solder including 0.5-10% Ag, SnCu solder including 0.3-5% Cu, in some cases with an Ni doping, and the special cases of In—Sn (In52-Sn48) solder and Bi—Sn (Bi58-Sn42), in which the Sn forms the minority component, but may also be considered tin-rich in the present context.

In various embodiments, instead of the tin-rich material, In96.5-Ag3.5 or In66-Bi34 solder may be used.

In various embodiments, apart from the Ni—Sn-phases, additional phases may form following the lever rule according to the alloying elements in the tin-rich solder material.

Only after a further reaction with nickel from the larger particles and the nickel-plated interfaces, the majority of the interconnect material may be converted to high-melting-point IMC.

A main constituent (>80 at %) of the layer formed by the solder material after a hardening may be a $Ni_3Sn_4$ intermetallic phase (which may be stable up to 800° C.), or a $Ni_3Sn_2$ phase (which may be stable up to 1200° C.), or a mixture of the two phases, depending on the specific process flow. A small fraction of $Ag_3Sn$-phases may be likely to appear close to the interface with the chip metallization 220B, 220F if the chip metallization 220B, 220F contains silver. However, this may be of no concern, since it may be highly temperature stable up to 480° C. No phases consisting of silver and nickel may exist. Experience with Ni/Sn diffusion solder shows that ternary phases may be neglected.

Phrasing it differently, the bimodal distribution of nickel particles in the solder material may allow the small nickel particles to melt first during the soldering process, and to distribute evenly within the liquefied solder material and in contact with metal (e.g. nickel) surfaces to be connected, and to reach a high nickel content in the liquefied solder material that may be required for the forming of the intermetallic phase (and thus the hardening of the solder material) only after a fraction of the nickel included in the large nickel particles has melted.

In various embodiments, the solder material and a connection formed using the solder material may fulfill the above requested requirements, e.g. regarding versatility, consts, etc. In particular, a melting temperature of the resulting interconnect may be above 270° C., such that the interconnect may be able to withstand second level soldering. For the second level soldering, the solder material according to various embodiments may be used.

In various embodiments, the solder material may be used for mounting a die, for example for mounting the die to a conductive substrate, for example to a leadframe.

In various embodiments, the solder material may be used for attaching an electrically conductive structure to a die, for example for attaching a clip to the die.

In various embodiments, the solder material may be used for attaching a chip package to a printed circuit board (PCB) or the like.

In various embodiments, a layer structure may be formed by mounting a chip or a chip package to a metal layer using the solder material. The metal layer may have a top layer (optionally with a thin (e.g., a few nanometers thick) protective layer) including or consisting of tin. Similarly, a chip contact surface may have a top layer (optionally with a thin (e.g., a few nanometers thick) protective layer) including or consisting of tin.

As another way to phrase it, in a layer structure, a chip or a chip package may be mounted to a conductive substrate (which may have a nickel-containing tin layer as one of the connection partners) and/or may be connected to a conductive structure (which may have a nickel-containing tin layer as one of the connection partners) using the solder material in accordance with various embodiments.

In various embodiments, a dedicated metallization may be provided on chip contact surfaces to be soldered and/or on the conductive substrate and/or the conductive structure, respectively. The chip contact surfaces may, for example, include or consist of one or more layers on the die front- and/or backside. The metallization on the conductive substrate may for example be one or more layers on a leadframe or the like. The metallization on the conductive structure may for example be one or more layers on a clip, a spacer, a substrate as used for direct copper bonding, or the like.

The interconnect may in various embodiments be formed using one or more layers in combination with a nickel (Ni) and tin (Sn) based paste with a high nickel content (nickel content between, for example, 35 at % and 90 at %). This may allow to reach a melting temperature Tmelt>270° C. More specifically, a composition that has a nickel content of 35 at % to 50 at % may be preferred.

The dedicated metallization (e.g., plating) may in various embodiments be configured to avoid a strong intermetallic growth and Kirkendall voiding between a metal of the conductive substrate or the conductive structure, respectively, which may for example include or consist of copper (Cu) as one of the connection partners and tin (Sn) as the other of the connection partners. The plating may include a nickel layer that may act as a diffusion barrier (against a mixing of copper and tin) and as an alloying element.

In various embodiments, a composition of the solder material and of the metal layers forming part of the interconnect may be configured in such a way that, after the solder process, no pure tin may remain in a fillet area. Configurations that may be suitable for achieving this may include the above described amounts of nickel and/or tin in the solder material, in particular the amount of nickel provided as the small particles and as the large particles, respectively In various embodiments, by forming an interconnect using the solder material as described above, the interconnect layer as a whole may be close to thermodynamic equilibrium. As a result of this, further alloying during a subsequent heat treatment (e.g. during reliability testing or in the application) may be reduced, and a mechanical stability may be increased. This may result in a higher flexibility regarding an overall design, because thicknesses of platings and chip metallizations, e.g. chip contact surfaces, contact surfaces of PCBs, etc., may be reduced.

The solder material in accordance with various embodiments has been demonstrated to work on bare Cu and on NiP. Furthermore, any other typical PCB-, chip-, and/or leadframe metallization may be used for forming the layer structure in accordance with various embodiments using the solder material.

By nickel plating all surfaces that are in contact with the solder material, a Kirkendall voiding at a reaction front Sn—Cu may be avoided. Furthermore, a volume shrink due to ongoing phase formation may be avoided. Thus, reliability of the solder joint may be increased.

The proposed lead free system may in various embodiments include a conductive Cu based element (some dopings might be included) having a thickness from about 100 μm to about 5 mm. The conductive element may be partly or fully plated with a nickel layer having a thickness in the range from about 100 nm to about 5 μm. The lead-free system may further include a NiSn based soft solder. The nickel portion of the solder may be in a range from about 35 at % to about 90 at %. Besides tin, further materials may be part of the solder, e.g. silver (Ag), gold (Au), platinum (Pt), and/or palladium (Pd).

Using the solder material in accordance with various embodiments for attaching a chip to a substrate, an increased stability of the so-called die attach may be achieved, due to the high-temperature intermetallic phases.

In various embodiments, the solder material may be used for a so-called second level mounting process, for example for attaching a chip package to a conductive substrate (or, respectively, to a substrate with conductive portions, for example at least one contact pad), for example to a printed circuit board (PCB). An increased stability of the interconnect between the chip package and the conductive substrate may be achieved, due to the high-temperature intermetallic phases.

Figure 1A:
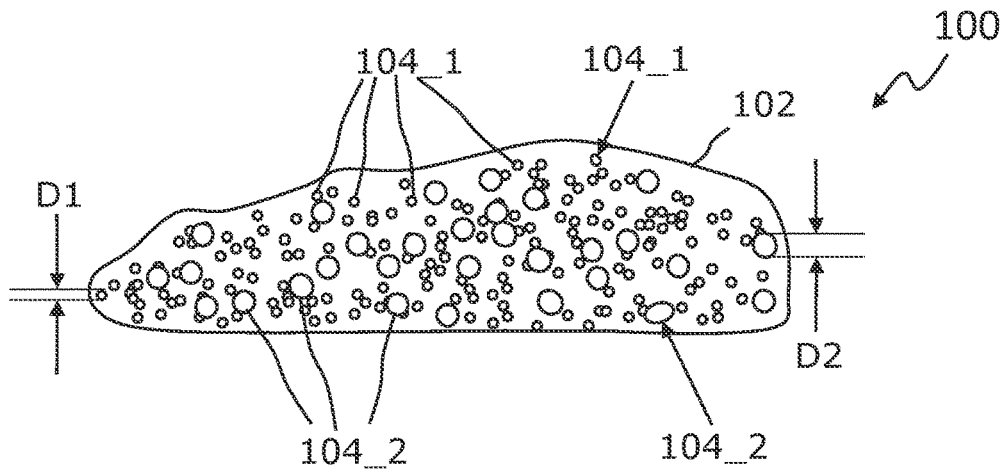
FIG. 1D illustrates, as a sequence of schematic drawings, how the solder material in accordance with various embodiments is transformed during a soldering process.
Figure 1B:
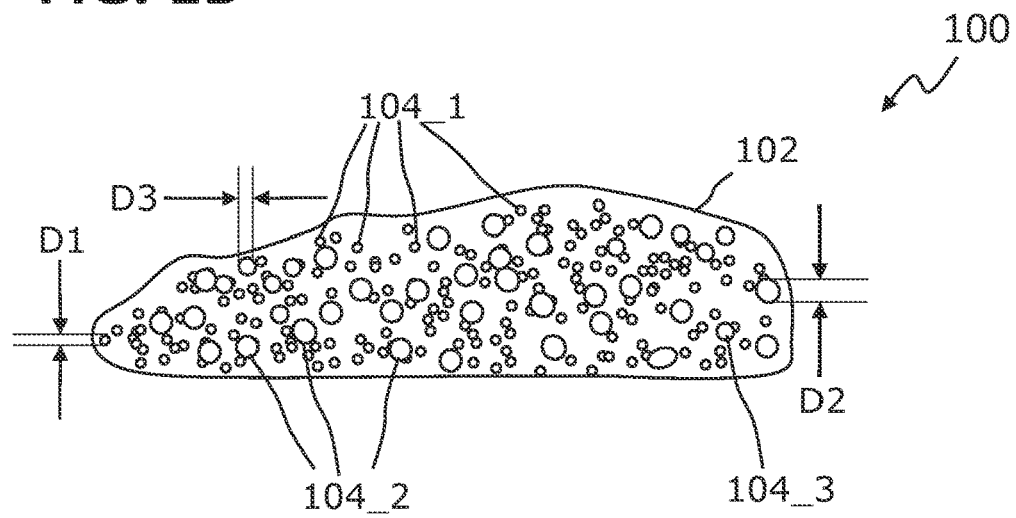
Figure 1C:
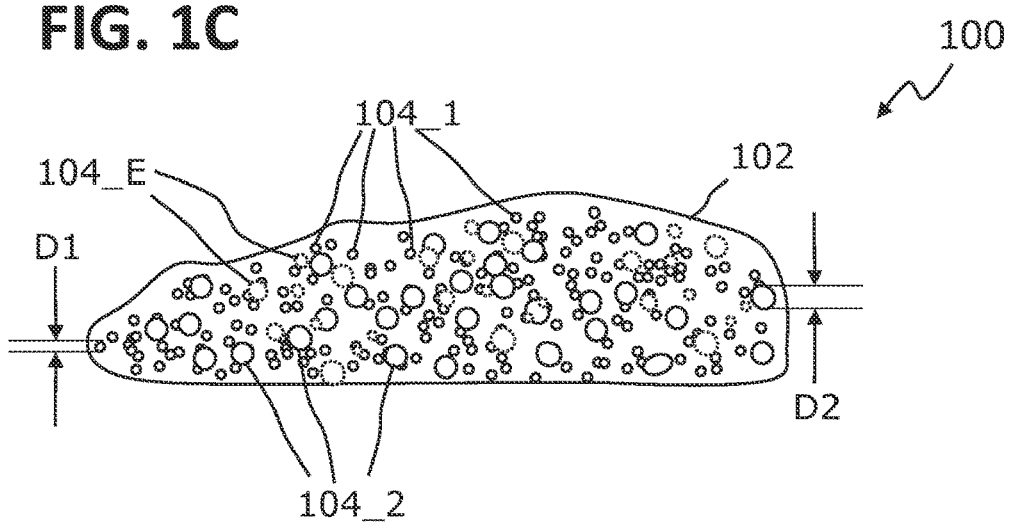
Figure 1D:
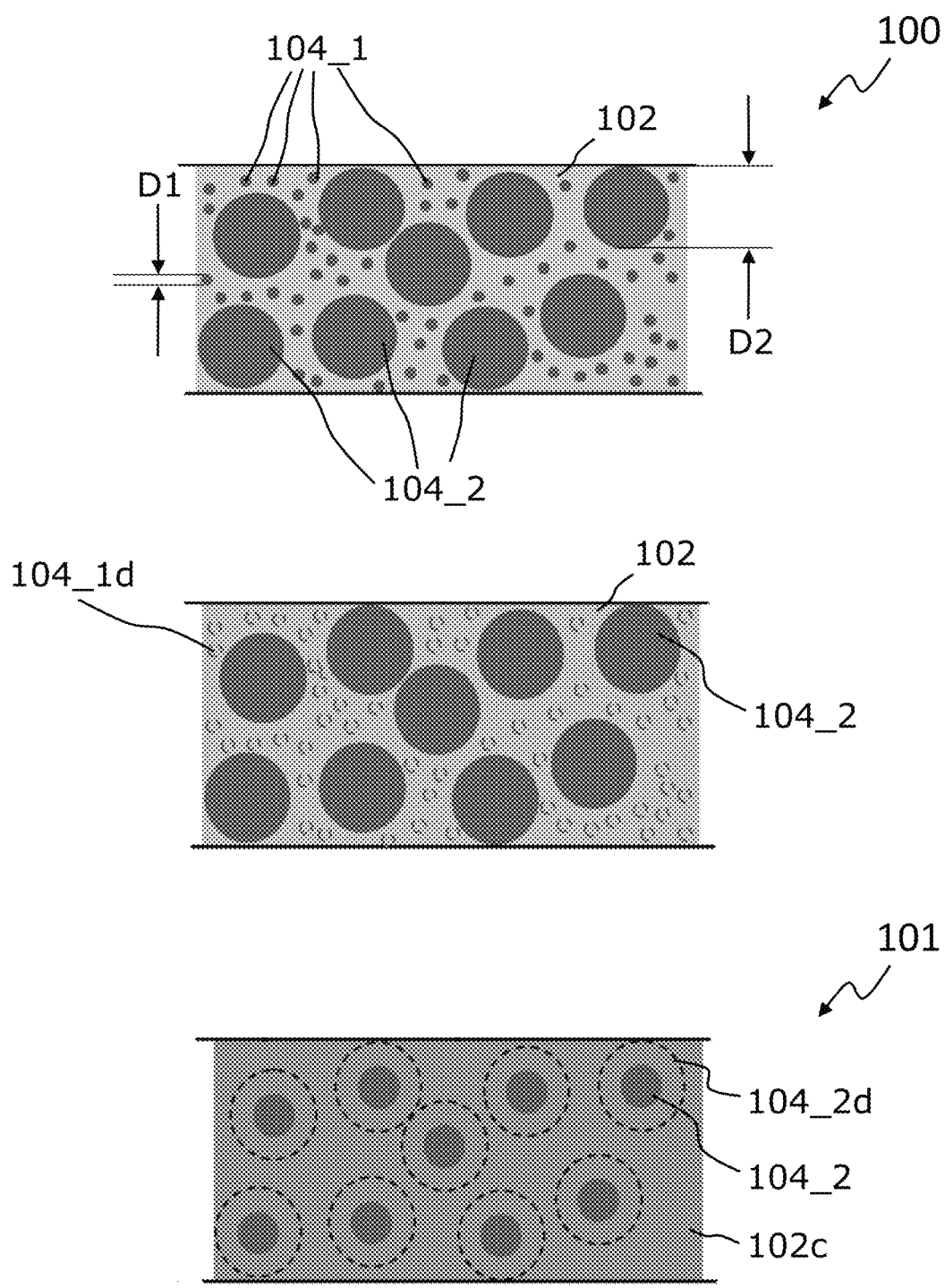

Each of FIG. 1A to FIG. 1C shows an illustration if a solder material 100 in accordance with various embodiments, FIG. 1D illustrates, as a sequence of schematic drawings, how the solder material 100 in accordance with various embodiments is transformed during a soldering process, resulting in a layer 101 that is lateron usually referred to as a second layer 101, FIG. 9 shows a microscope image of a surface of a vertically cut layer structure 200 in accordance with various embodiments that reveals structural details of the (second) layer 101, and each of FIG. 5A and FIG. 5B shows particle distributions of a first amount of particles and of a second amount of particles in a solder material in accordance with various embodiments.

The solder material 100 may include nickel and tin.

The nickel may include, e.g. be provided as, a first amount of particles 104_1 and a second amount of particles 104_2. The first amount of particles 104_1 and the second amount of particles 104_2 may be distributed in a solder base material 102.

A sum of the first amount of particles 104_1 and the second amount of particles 104_2 may be a total amount of the nickel or less, wherein the first amount of particles 104_1 may be between 5 at % and 60 at % of the total amount of the nickel, for example between 25 at % and 60 at %, and wherein the second amount of particles 104_2 may be between 10 at % and 95 at %, for example between 10 at % and 75 at %, of the total amount of the nickel.

The particles of the first amount of particles 104_1 may have a size in a range from about 1 μm to about 20 μm, e.g. between about 3 μm and 7 μm or between about 5 μm and 15 μm. The particles of the second amount of particles 104_2 may have a size in a range from about 30 μm to about 50 μm, for example between about 35 μm and about 40 μm.

The lower limit of the size of the first amount of particles 104_1 may be set to be about 1 μm. Thereby, it may be ensured that the first amount of particles 104_1 may not be affected by restrictive legislation regarding nanoparticles. Furthermore, the size of 1 μm or more may mean that an effect of an oxidation of the small particles may be limited to a tolerable level.

The lower limit of the size of the second amount of particles 104_2 may be set to be about 30 μm. This may ensure that, depending on what is desired, a core of the large nickel particles 104_2 may remain as cores of pure nickel after the soldering, or that the second amount of particles 104_2 has a size that is also dissolved. A maximum size of the second amount of particles 104_1 may be determined by a thickness of bond lines to be arranged between two metal surfaces to be connected by the solder material 100, wherein the bond lines may set the separation between the two metal surfaces. The maximum size of each of the second amount of particles 104_2 may be smaller than about half the thickness of the normal bond lines (which may be about 80 μm to 100 μm, such that the maximum size of the second amount of particles 104_2 may be between about 40 μm and about 50 μm.

Each of FIG. 5A and FIG. 5B shows particle distributions of a combination of a first amount of particles 104_1 and of a second amount of particles 104_2 in a solder material 100 in accordance with various embodiments.

In various embodiments, all the nickel in the solder material 100 may be contributed by the first amount of particles 104_1 and by the second amount of particles 104_2. Such an embodiment is shown in FIG. 5A. An absolute or relative amount of at % contributed by the first amount of particles 104_1 and by the second amount of particles 104_2, respectively, may be difficult to estimate from this qualitative visualization, because a volume (and hence a number of atoms) of each of the larger particles 104_2 is much bigger than a volume (and hence a number of atoms) of each of the smaller particles 104_1.

In various embodiments, only a fraction of the nickel in the solder material 100 may be contributed by the first amount of particles 104_1 and by the second amount of particles 104_2. In various embodiments, the solder material 100 may include further particles 550 in addition to the first amount of particles 104_1 and the second amount of particles 104_2. Such an embodiment is shown in FIG. 1C and in FIG. 5B.

The first amount of particles 104_1 may have sizes between about 5 µm and about 15 µm. The second amount of particles 104_2 may have sizes between about 30 µm and about 50 µm. The size distribution of the second amount of particles 104_2 may be part of a larger size distribution ranging from the minimum size for the first amount of particles 104_1 to the maximum size of the second amount of particles 104_2, and which may include, apart from the second amount of particles 104_2 and some of the first amount of particles 104_1, a further amount of particles 104_E (see FIG. 1C). The broad particle size distribution of the large particles 104_2 may for example be obtained by precipitation or the like with subsequent sifting.

In various embodiments, the nickel may further include a third amount of particles 104_3, wherein a sum of the first amount of particles 104_1, the second amount of particles 104_2, and the third amount of particles 104_3 is the total amount of the nickel or less. The third amount of particles 104_3 may contribute between 10 at % and 85 at % (for example between 10 at % and 65 at %) of the total amount of the nickel. The particles of the third amount of particles 104_3 may have a size in a range from more than about 20 µm to less than about 30 µm. A corresponding embodiment is shown in FIG. 1B. The particles 104_1, 104_2, 104_3 in the solder material 100 may thus have a trimodal distribution, which may allow to fine-tune a formation of the intermetallic phase even better.

The particles of the third amount of particles may in various embodiments have a third size distribution. 30% to 70% of the third amount of particles may have a particle size that is in a range of about 5 µm around a particle size the highest number of particles have according to the third size distribution. In other words, most or at least a large fraction of the third amount of particles may have a most frequent size or a size close to the most frequent size, e.g. about ±2.5 µm around the most frequent size.

In various embodiments, the particles may be spherical or essentially spherical, for example as opposed to a spattered particle shape. For example, the particles may have an outer surface with only convex portions, i.e. without concave portions on the surface. In FIG. 1A to 1C, most of the particles 104_1, 104_2, 104_3 are represented by circles indicating spherical particles. However, the two particles indicated by arrows are illustrated as ellipses indicating ellipsoid particles.

The size of each of the particles 104_1, 104_2, 104_3 may be understood to be an average of its size along its longest axis and a size along its shortest axis (which in case of the spherical particle are identical).

In various embodiments, a nickel amount of the solder material 100 may be in a range from about 35 at % to about 90 at %. A remaining portion of the solder material 100, i.e. between about 10 at % and about 65 at % of the solder material 100, may partially or completely be formed by tin. Besides tin, further materials may be part of the solder, e.g. silver (Ag), gold (Au), platinum (Pt), and/or palladium (Pd).

The solder material 100 may in various embodiments be configured as a solder paste, for example as a tin based soft solder, for example as the solder base material 102 in which the first amount of particles 104_1 and the second amount of particles 104_2 (and, optionally, the third amount of particles 104_3 and/or the further particles 104_E) are distributed.

In various embodiments, the solder material 100 may be configured as a solder wire including the tin and the nickel particles 104_1, 104_2 (and, optionally, the third amount of particles 104_3 and/or the further particles 104_E), or as a different kind of preformed solid solder material, e.g. a solder sheet (which may optionally be pre-shaped to fit a foreseen application). The preformed solder material may for example be formed as a compacted solder powder or as a solder preform.

A behavior during the soldering process for which the solder material 100 is configured is illustrated by FIG. 1D and FIG. 9, and will be further described in context with a layer structure 200 in accordance with various embodiments, for example as shown in FIG. 2A to FIG. 2J, in FIG. 3A or FIG. 3B.

In FIG. 1D, the top view shows the solder material 100 in accordance with various embodiments before the soldering process. The first amount of particles 104_1 and the second amount of particles 104_2 may be distributed in the solder base material 102. The middle view shows an intermediate stage of the soldering process, in which the small particles, i.e. the first amount of particles 104_1, are already dissolved (and therefore shown as broken lines and labelled as 104_1d), whereas the large particles, i.e. the second amount of particles 104_2, are more or less unchanged. The bottom view shows the resulting (second) layer 101, wherein an outer portion 104_1d of the second amount of particles 104_2 is also dissolved, and the base material 102, together with the dissolved first amount of particles 104_1d and the dissolved portion 104_2d of the second amount of particles 104_2 form a converted base material 102c.

The conversion process and constituents and properties of the (second) layer 101 and the converted base material 102c are described elsewhere herein, but some features will be briefly described with reference to FIG. 9, where the (second) layer 101 is formed between a silicon chip 220 with a backside metallization 222, 220B as the first layer 222 and a copper substrate 224 as the third layer 222.

The (second) layer 101 may include the high-temperature Ni—Sn phase 992, and, in this particular embodiment, because the first layer 222 may be formed by a copper layer (e.g., a leadframe) 224, a high-temperature Cu—Sn—Ni-phase 998. The nickel and tin containing phases 992, 998 may form an interconnected structure with a high melting point. The interconnected structure may for example act like a stabilizing skeleton, for example during a use of a device including the layer structure 200, and/or during further heating processes, for example during a second level mounting process, and in particular during thermal cycling it may be much less prone to fatigue due to cyclic deformation. The interconnected structure may for example have a sponge-like shape.

Small portions of unconverted solder material 100 may in various embodiments remain, for example embedded in the skeleton structure. Furthermore, voids 996 may have formed in the (second) layer during the soldering process. The nickel and tin containing phases 992, 998, the unconverted solder material 100 and the voids 996 may together form or be part of the converted base material 102c.

Embedded in the converted base material 102c, at least a portion of each of the second amount of particles 104_2 may remain undissolved.

Each of FIG. 2A to FIG. 2J, FIG. 3A and FIG. 3B shows a schematic cross-sectional view of a layer structure 200 in accordance with various embodiments.

In the exemplary embodiments of FIG. 2A to FIG. 2H, FIG. 2J, FIG. 3A and FIG. 3B, the layer structure 200 includes a chip 220 (also referred to as die). The chip 220 may for example be a semiconductor chip, e.g., based on silicon (Si), silicon carbide (SiC), gallium nitride (GaN), or other semiconductor materials as known in the art. A thickness of the chip 220 may be in a range from about 20 μm to about 380 μm, wherein the thickness may include the chip metallizations 220B, 220F.

Figure 2A:
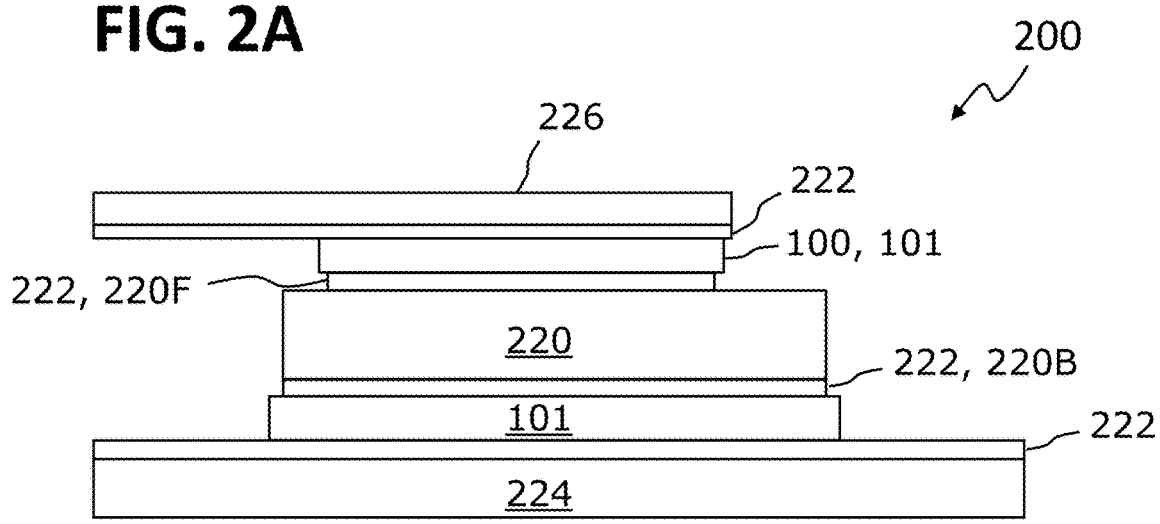
Figure 2B:
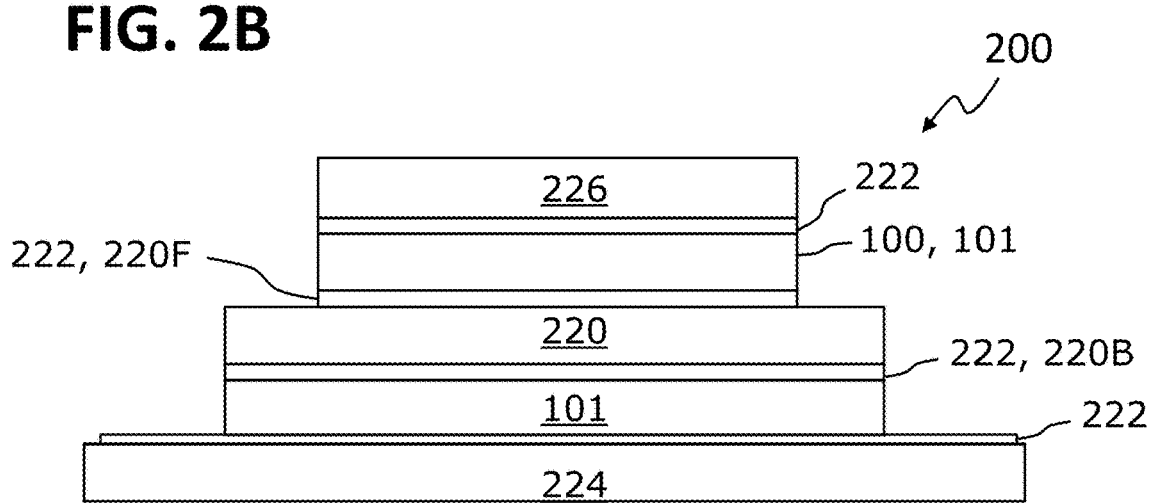
Figure 2C:
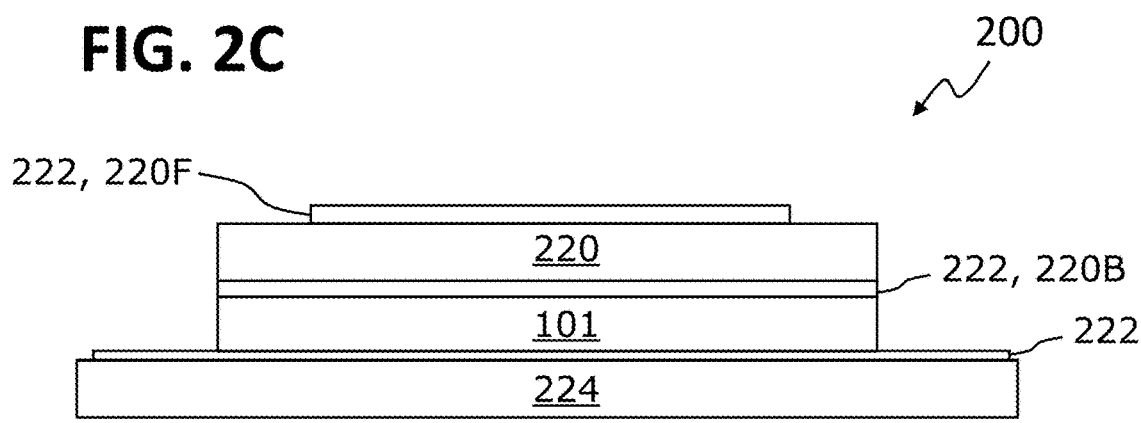
Figure 2D:
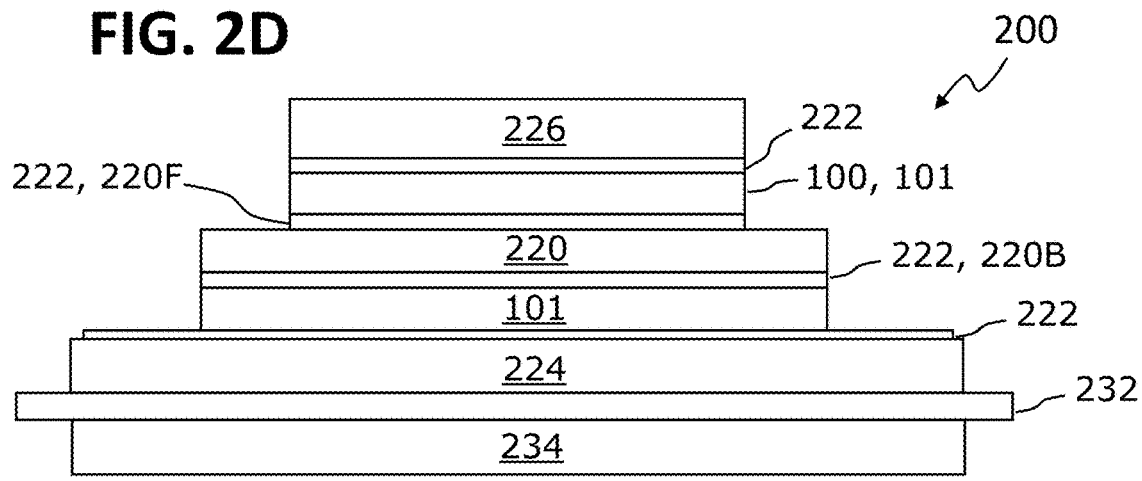
Figure 2E:
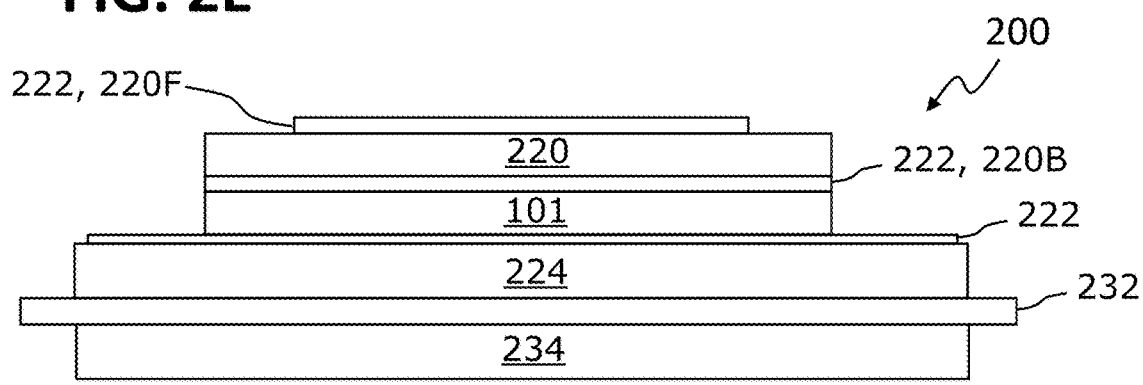
Figure 2F:
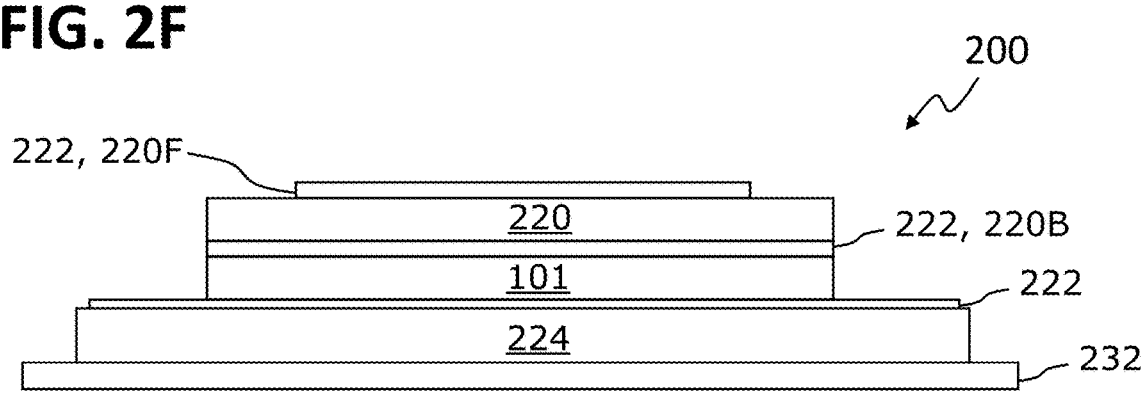
Figure 2G:
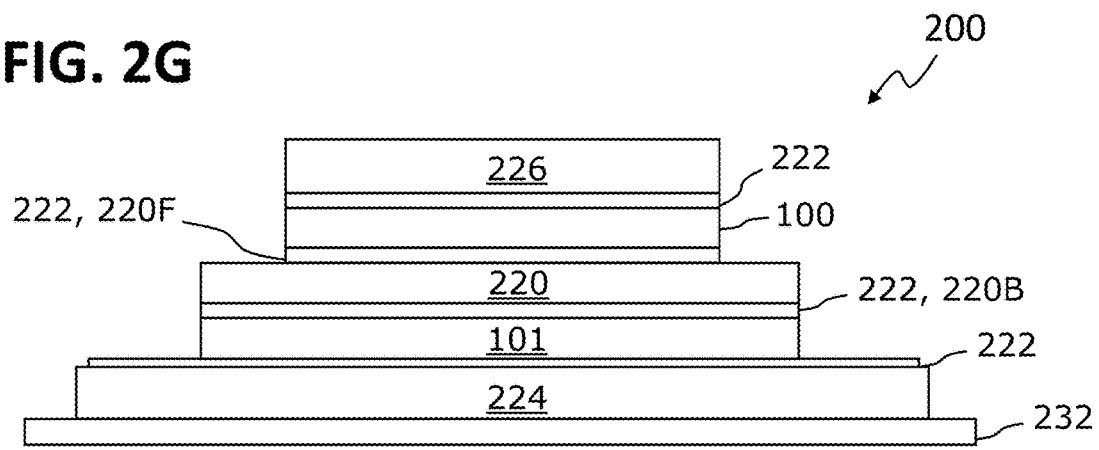
Figure 2H:
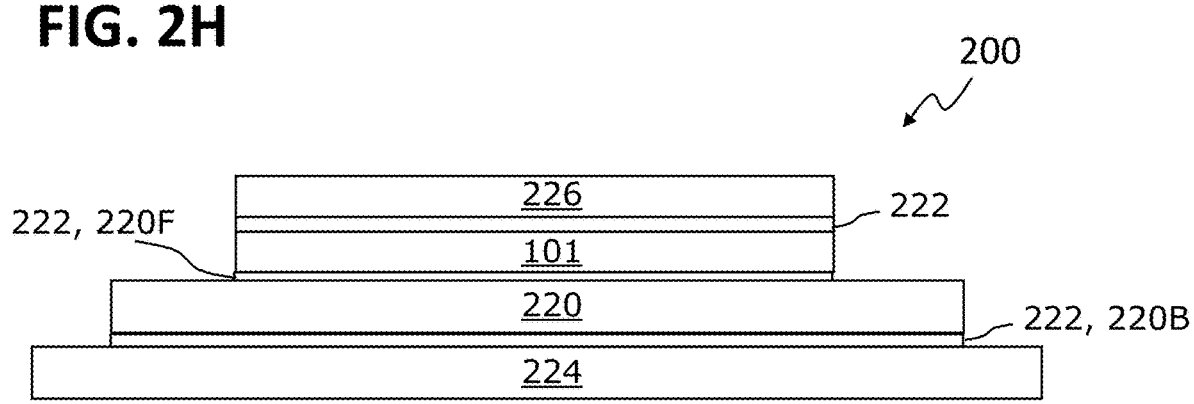
Figure 2I:
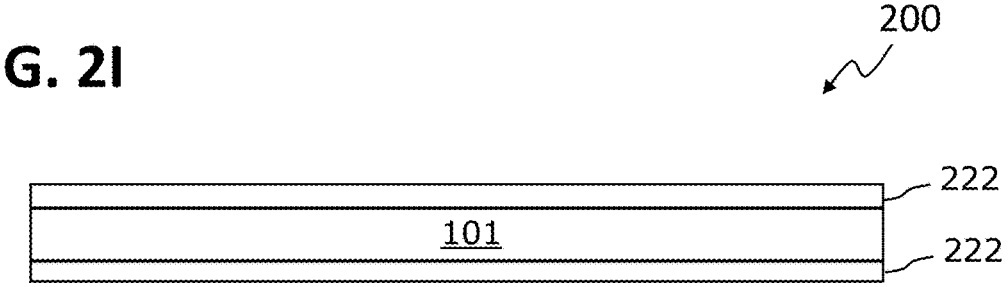

Various embodiments may not include a chip 220, as shown in the exemplary embodiment of FIG. 2I.

The layer structure 200 may include a first layer 222, which may including nickel or a nickel alloy or a different metal typically used for a chip metallization, for example copper, gold, silver, tin, zinc, platinum, and/or palladium, and a third layer 222 including nickel or a nickel alloy or a different metal typically used for a conductive substrate 224, 222 (e.g., a leadframe) and/or for a conductive layer 222 formed on the substrate 224, for example copper, gold, tin, silver, zinc, platinum, and/or palladium, and a second layer 101 between the first layer 222 and the third layer 222.

The first layer 222 and the third layer 222 may be similar or identical or may be configured differently. Since they are, however, in principle interchangeable, they are identified by the same reference sign 222.

The following table shows what kind of metallization may be suitable as the first layer 222 or as the second layer 222, respectively (in exemplary fashion for a frontside metallization FSM, for a backside metallization BSM, and for a PCB metallization, respectively):

|  | FSM | BSM | PCB |
|---|---|---|---|
| X/NiV/Ag | + | + | N/A |
| NiP/Pd/Au | + | + | N/A |
| X/NiV/Au | + | + | N/A |
| X/NiSi/Ag | (+) | + | N/A |
| NiP | (+) | (+) | + |
| Cu | + | + | + |
| Underlayer/Sn | N/A | N/A | + |
| Underlayer/SnPb | N/A | N/A | (+) possible, but not Pb-free |
| Underlayer/Ag | N/A | N/A | + |
| Underlayer/Au/ ENIG (Electroless Nickel Immersion Gold)/ENEPIG (Electroless Nickel Electroless Palladium Immersion Gold) | N/A | N/A | + |

In the table, X may represent any suitable metal, e.g. as known in the art, e.g. copper, a copper alloy, aluminum, an aluminum alloy, or the like. Entries in the table may indicate a suitability for forming the layer structure 200 using the solder material 100 in accordance with various embodiments. + may indicate good suitability, + may indicate very good suitability, and (+) may indicate limited/reduced suitability.

Regarding a Cu metallization, a key issue in combination with a tin-rich solder may be a continuing Cu—Sn phase formation, which may usually lead to a full consumption of the copper and a subsequent failure of the device. However, experiments have shown (see, e.g., FIG. 9) that Cu is an applicable metallization, since a large fraction of the tin may be converted to the thermodynamically stable, high-temperature Ni—Sn phases, and only a small amount of tin, if any, may be available for the Cu—Sn phase formation, such that the Cu layer is typically not consumed completely.

The second layer 101 may be formed from the solder material 100. To differentiate between the solder material 100 before the soldering process and the solder layer 101 formed by the soldering process, different reference signs 100, 101 are used.

The first layer 222 and/or the third layer 222 may include, consists of, or essentially consists of at least one of a group including nickel, nickel vanadium (NiV), a nickel phosphide, e.g. NiP, nickel silicide (NiSi), copper, gold, silver, tin, zinc, platinum, and palladium, and/or an alloy of any of these materials.

A thickness of the first layer 222 and/or a thickness of the third layer 222 may be in a range from about 100 nm to about 5 μm.

As shown in FIG. 2J, the electrically conductive substrate 224 may have, on its bottom side, which may be facing away from the second layer 101, a further layer 222.

In FIG. 2I, the first layer 222 and the third layer 222 are shown without any additional element that they may be attached to (except the second layer 101). Typically, however, each of the first layer 222 and/or the third layer 222 may be part of or fixed to an element or a device that is supposed to be connected by the second layer 101.

Exemplary embodiments of layer structures 200 that include such elements or devices are shown in FIG. 2A to FIG. 2H, FIG. 3A and FIG. 3B.

The layer structure 200 may, in various embodiments, include a plurality of first layers 222, a plurality of second layers 101, and a plurality of third layers 222.

In various embodiments, at least one of the first layer 222 and of the third layer 222 may be or include a chip metallization 220B, 220F, also referred to as contact surface. Chip metallizations 220B, 220F may be present on two opposite sides of the chip 220, referred to as backside metallization 220B and frontside metallization 220F, respectively. One or both of the chip metallizations 220F, 220B may include or consist of nickel and/or a nickel alloy. In various embodiments, the nickel and/or nickel alloy may be capped by a metal finish (e.g. Ni/Au, NiP/Pd/Au, etc.) to avoid oxidation. The metal finish may be configured in such a way, e.g. regarding thickness, composition, etc., that the soldering process as described herein, in particular the forming of the intermetallic phase, is undisturbed or essentially undisturbed.

A thickness of one or both of the chip metallizations 220F, 220B may at least 200 nm, e.g. in a range from about 200 nm to about 5 μm.

In the exemplary embodiment of FIG. 2A, a first interconnect may be formed by one of the first layers 222, which may be a nickel-containing plating layer 222 formed on an electrically conductive substrate 224, e.g. on a leadframe, e.g. a copper leadframe, one of the second layers 101 connected to the first layer 222, and one of the third layers 222, which may be a nickel-containing backside metallization 220B of a chip 220, also referred to as a contact surface of the chip 220, i.e. a backside contact surface.

A second interconnect may be formed by another of the first layers 222, which may be a nickel-containing frontside metallization 220F of a chip 220, another of the second layers 101 connected to the first layer 222, and another of the third layers 222, which may be a nickel-containing plating layer 222 formed on an electrically conductive structure 226, e.g. on a clip, e.g. a copper clip, or the like. The embodiment of FIG. 2B may differ from the embodiment of FIG. 2A essentially in that the second interconnect does not include the clip carrying the another of the third layers 222. Instead, a differently configured metal contact 226, e.g. a copper contact, may be provided on which the another of the third layers 222 is formed.

The embodiment of FIG. 2C may differ from the embodiments of FIG. 2A and FIG. 2B essentially in that the second interconnect is not formed. Instead, the frontside metallization 220F of the chip 220 may be exposed, for example for being contacted by conventional means, e.g. as described above, e.g. by a diffusion solder interconnect.

The embodiment of FIG. 2D may differ from the embodiment of FIG. 2B essentially in that the electrically conductive substrate 224 of FIG. 2D is replaced by an isolated substrate 224, 232, 234 including an electrically conductive layer 224, e.g. a copper layer, having the first layer 222 formed on its front side, a ceramics layer 232 attached with its front side to a backside of the electrically conductive layer 224, and a metal layer 234 attached to a backside of the ceramics layer 232.

To indicate that the two second layers 101 may be either formed in a common soldering process (in which case both layers would be converted from a layer of solder material 100 to the second layer 101 at the same time) or in successive processes (in which case a first of the layers of solder material 100 would have been converted to the second layer 100 before a further of the layers of solder material 100 is applied and later converted to a further second layer 101), the respective layers are labelled in FIG. 2B, FIG. 2C and FIG. 2D with both reference numbers, 100 and 101.

The embodiment of FIG. 2E may differ from the embodiment of FIG. 2C essentially in that the electrically conductive substrate 224 of FIG. 2D is replaced by an isolated substrate 224, 232, 234 including an electrically conductive layer 224, e.g. a copper layer, having the first layer 222 formed on its front side, a ceramics layer 232 attached with its front side to a backside of the electrically conductive layer 224, and a metal layer 234 attached to a backside of the ceramics layer 232.

The embodiment of FIG. 2F may differ from the embodiment of FIG. 2E essentially in that the isolated substrate 224, 232, 234 is not provided, but instead a two-layered isolated substrate 224, 232 is provided. The two-layered isolated substrate 224, 232 may include an electrically conductive layer 224, e.g. a copper layer, having the first layer 222 formed on its front side, and an electrically insulating layer 232 attached with its front side to a backside of the electrically conductive layer 224. The electrically insulating layer 232 may include or consist of any electrically insulating material(s) used in the art for isolated substrates, e.g. ceramics, glass, an organic material, etc.

The embodiment of FIG. 2G may differ from the embodiment of FIG. 2D essentially in that the isolated substrate 224, 232, 234 is not provided, but instead a two-layered isolated substrate 224, 232 is provided. The two-layered isolated substrate 224, 232 may include an electrically conductive layer 224, e.g. a copper layer, having the first layer 222 formed on its front side, and an electrically insulating layer 232 attached with its front side to a backside of the electrically conductive layer 224. The electrically insulating layer 232 may include or consist of any electrically insulating material(s) used in the art for isolated substrates, e.g. ceramics, glass, an organic material, etc.

The embodiment of FIG. 2H may differ from the embodiment of FIG. 2B in that the first interconnect is not formed. Instead, the backside 220B of the chip 220 may be attached to the electrically conductive substrate 224 by diffusion soldering.

In various embodiments, the second layer 101 may consist of or essentially consist of nickel and tin.

The embodiments of layer structures 200 shown in FIG. 3A and FIG. 3B, respectively, may be similar or identical to the layer structure 200 of FIG. 2C, except for visualizing properties of the second layer 101.

The second layer 101 may include an intermetallic phase of nickel and tin.

In various embodiments, an exemplary embodiment of which is shown in FIG. 3A, the second layer 101 may consist of or essentially consist of the intermetallic phase. In this case, an absolute amount of nickel contained in the first amount of particles 104_1 and in the second amount of particles 104_2 of the solder material 100, and/or a relative amount of nickel contained in the first amount of particles 104_1 and in the second amount of particles 104_2, respectively, and/or an absolute and/or relative size of the first amount of particles 104_1 and the second amount of particles 104_2 may have been selected such that not only the first amount of particles 104_1 melted completely, but also the second amount of particles 104_2 essentially or completely melted to form the intermetallic phase.

In various embodiments, an exemplary embodiment of which is shown in FIG. 3B, the second layer 101 may include nickel particles 104_2 having a size that is larger than a thickness of the first layer 222 and/or larger than a thickness of the third layer 222. The nickel particles 104_2 may be remnants of the amount of second particles 104_2, i.e. of the larger particles 104_2, that were originally contained in the solder material 100. During the soldering process, a fraction of the larger particles 104_2 may have melted when a temperature of the solder material 100 surrounding the larger particles 104_2 reached a melting temperature of the nickel. However, before melting the whole larger nickel particles 104_2, the melted solder material 100 reached a composition that was suitable for forming the intermetallic phase, and thus solidified, thereby enclosing the remaining larger particles 104_2.

A similar situation may occur if particles having a size that is different from the size of the first amount of particles 104_1 and/or from the size of the second amount of particles 104_2, e.g. the third amount of particles 104_3 and/or the further particles 104_E. Particles up to a limiting size may have been completely melted and included in the intermetallic phase, whereas remnants of the particles larger than the limiting size may remain in the second layer 101. The limiting size may be higher than a maximum size of the first amount of particles 104_1 present in the solder material 100.

In other words, the second layer 101 may further include further nickel particles having a size that is smaller than the size of the nickel particles 104_2.

In various embodiments, the intermetallic phase may form between about 80% and about 95% by weight of the second layer 101.

The intermetallic phase may in various embodiments consists of or essentially consists of $Ni_3Sn_4$ and/or $Ni_3Sn_2$.

A thickness of the second layer 101 may be in a range from about 50 μm to about 70 μm.

Each of FIG. 4A and FIG. 4B shows a schematic cross-sectional view of a chip package 400 in accordance with various embodiments.

The chip package 400 may include a layer structure 200 as described above, for example as described in context with any of the embodiments of FIG. 2A to FIG. 2J, FIG. 3A and/or FIG. 3B. For illustrative purposes, the embodiment of FIG. 2C was selected as a basis for the chip package 400.

The chip package 400 may include a chip 220. The chip 220 is already included in the embodiments of layer structures 200 of FIG. 2A to FIG. 2H, FIG. 3A and FIG. 3B, but would need to be added to the embodiment of the layer structure 200 of FIG. 2J.

The chip 220 may include the first layer 222, e.g. as a (e.g., backside) chip metallization 220B, a conductive substrate 224, 222 including the third layer 222, and an encapsulation 440 at least partially encapsulating the chip 220 and at least one of the first layer 222, 220B, the second layer 100, and the third layer 222.

The encapsulation 440 may include or consist of an encapsulation material as known in the art, and may be arranged by known processes.

In the exemplary embodiment shown in FIG. 4B, the layer structure 200 of FIG. 2J was used as a basis for the chip package 400. However, any other layer structure 200 in accordance with various embodiments may be used as a respective basis for the chip package 400. A difference between the chip package 400 of FIG. 4A and the chip package 400 of FIG. 4B may be that the conductive substrate 224 of FIG. 4A may either not be suitable as a (further) layer 222, or may optionally be suitable as a (further) layer 222, and that the conductive substrate 224 of FIG. 4B may have a (further) layer 222 arranged on its bottom side opposite the chip 220. The (further) layer 222 or a respective suitability may refer to a suitability for being soldered using the solder material 100 in accordance with various embodiments.

The chip package 400 of FIG. 4B (or, optionally, of FIG. 4A) may be configured to be soldered to a contact pad, for example to a contact pad of a printed circuit board. The conductive substrate 224 forming or including the layer 222, or at least one or more portions thereof, may be configured for electrically contacting the chip and may therefore be referred to as metal leads. They may be exposed from or protruding from the encapsulation 440 of the chip package 400.

Each of FIGS. 10A and 10B shows a schematic cross-sectional view of a chip arrangement 1000 in accordance with various embodiments.

The chip arrangement 1000 may include a chip package 400 in accordance with various embodiments, for example as shown in FIG. 4A and FIG. 4B.

The chip package 400 may include one or more metal leads 224, 222 (in each of FIGS. 10A and 10B, two metal leads 224, 222 are shown) that may be configured for electrically contacting the chip 220. The metal leads 224, 222 may be exposed, and may have an outer surface forming a layer 222, for example by providing the conductive substrate 224 with a material that may be suitable for being soldered with the solder 100, or by providing a suitable layer 222 over the conductive substrate 224.

The chip arrangement 1000 may further include a printed circuit board 1100, which may include a base material 1110 (which may be dielectric) and at least one contact pad (1112)

The chip arrangement 1000 may further include a layer 101 between the at least one metal lead 224, 222 and the at least one contact pad 224, 222. The layer 101 may be similar or identical to the second layer 101 described above, for example in context with the layer structure 400. The layer 101 may be formed from the solder material 100. The layer 101 may be formed by the soldering process described above and below in accordance with various embodiments.

In various embodiments, the layer 101 may consists of or essentially consists of nickel and tin, and may include an intermetallic phase of nickel and tin. In various embodiments, the layer 101 may include nickel particles 104_2 having a size that is larger than a thickness of the metal lead 224, 222 and/or larger than a thickness of the contact pad 1112.

In various embodiments, the at least one metal lead 224, 222 and the at least one contact pad 1112, respectively may include at least one or consists of a material of a group of materials, the group including nickel, copper, gold, platinum, tin, zinc, palladium, and an alloy of any of these materials.

In various embodiments, the at least one metal lead 224, 222, and/or the at least one contact pad may include a plating layer 222.

In various embodiments, the plating layer 222 may include at least one or consists of a material of a group of materials, the group including nickel, copper, gold, palladium, and an alloy of any of these materials.

A thickness of the plating layer 222 may in various embodiments be in a range from about 100 nm to about 5 μm.

FIG. 6 shows a flow diagram 600 of a method of forming a layer structure in accordance with various embodiments.

The method may include arranging a layer of a solder material as described above in accordance with various embodiments between a first layer including nickel or a nickel alloy and a third layer including nickel or a nickel alloy (610).

Depending on the type of solder material that may be used, the arranging may be conducted differently, and essentially as known in the art, for example as known from solder materials containing lead.

For example, in a case of applying the solder material as a solder paste, the paste may be applied by dispensing or printing the paste onto the first layer and/or onto the second layer, e.g. onto the leadframe and/or onto the die frontside and/or onto the clip and/or onto the die backside. In a case of applying the solder material as a solder preform or other solid type of solder material, the solder preform etc. may be arranged over the first layer, and the second layer may be arranged over the solder material.

The method may further include heating the layer structure to a melting temperature of the solder material until an intermetallic phase forms (620).

In various embodiments, a plurality of solder interconnects may be formed simultaneously in the same layer structure, e.g. one over the other.

Alternatively, since a melting temperature of the intermetallic phase is much higher than a melting temperature of the solder material, sequential forming of solder interconnects in a device may be performed.

For example, after the arranging of the solder material between the first layer and the second layer, e.g. after placement of the chip on a leadframe and a clip on the die frontside (here, two solder connections may be formed simultaneously, one between the leadframe and the chip, and the other between the chip and the clip, which may lead to a layer structure as shown in FIG. 2A), thereby forming a stack, the stack may be heated in a reflow or box oven with a specific temperature profile adjusted to the mentioned materials and thicknesses. Alternatively, the two-step process with separate reflow processes for the die attach and for the clip attach may be performed.

FIG. 7 shows a flow diagram 700 of a method of forming a chip package in accordance with various embodiments.

The method may include arranging a layer of a solder material as described above in accordance with various embodiments between a first layer including nickel or a nickel alloy and a third layer including nickel or a nickel alloy, wherein the first layer is a chip metallization layer, and wherein the second layer is part of a conductive substrate (710).

The method may further include heating the layer structure to a melting temperature of the solder material until an intermetallic phase forms (720).

Up to this point, the method of forming a chip package may be identical to the method of forming a layer structure in a case of the first layer being a chip metallization layer, and the second layer being part of a conductive substrate.

The method may further include forming an encapsulation at least partially encapsulating the chip and the layer structure (730).

FIG. 8 shows a flow diagram 800 of a method of forming a chip arrangement.

The method may include arranging a layer of a solder material in accordance with various embodiments between at least one metal lead of a chip package and a contact pad of a printed circuit board (810), and heating the solder material to a melting temperature of the solder material until an intermetallic phase forms (820).

Various examples will be illustrated in the following:

Example 1 is a solder material. The solder material may include nickel and tin, wherein the nickel may include a first amount of particles and a second amount of particles, wherein a sum of the first amount of particles and the second amount of particles is a total amount of the nickel or less, wherein the first amount of particles is between 5 at % and 60 at % (preferably between 25 at % and 60 at %) of the total amount of the nickel, wherein the second amount of particles is between 10 at % and 95 at % (preferably between 10 at % and 75 at %) of the total amount of the nickel, wherein the particles of the first amount of particles have a size in a range from about 1 µm to about 20 µm, and wherein the particles of the second amount of particles have a size in a range from about 30 µm to about 50 µm.

In Example 2, the subject-matter of Example 1 may optionally include that the size of the particles of the first amount of particles have a size from about 3 µm to about 7 µm.

In Example 3, the subject-matter of Example 1 may optionally include that the size of the particles of the first amount of particles have a size from about 5 µm to about 15 µm.

In Example 4, the subject-matter of any of Examples 1 to 3 may optionally include that the size of the particles of the second amount of particles have a size from about 35 µm to about 40 µm.

In Example 5, the subject-matter of any of Examples 1 to 4 may optionally include that the particles are spherical or essentially spherical.

In Example 6, the subject-matter of any of Examples 1 to 5 may optionally include that the nickel includes a third amount of particles, wherein a sum of the first amount of particles, the second amount of particles, and the third amount of particles is a total amount of the nickel or less, wherein the third amount of particles is between 10 at % and 85 at % of the total amount of the nickel, and wherein the particles of the third amount of particles have a size in a range from more than 20 µm to less than 30 µm In Example 7, the subject-matter of any of Examples 1 to 6 may optionally include that a nickel amount of the solder material is in a range from about 35 at % to about 90 at %.

In Example 8, the subject-matter of any of Examples 1 to 7 may optionally include that the solder material is configured as a solder paste.

In Example 9, the subject-matter of Example 8 may optionally include that the solder paste includes a tin based soft solder, in which the first amount of particles and the second amount of particles are distributed.

In Example 10, the subject-matter of any of Examples 1 to 9 may optionally include that the solder material is configured as a solder wire.

In Example 11, the subject-matter of any of Examples 1 to 9 may optionally include that the solder material is configured as a compacted solder powder or as a solder preform.

Example 12 is a layer structure. The layer structure may include a first layer including nickel or a nickel alloy, a third layer including nickel or a nickel alloy, and a second layer between the first layer and the third layer, wherein the second layer consists of or essentially consists of nickel and tin, wherein the second layer includes an intermetallic phase of nickel and tin, and wherein, optionally, the second layer includes nickel particles having a size that is larger than a thickness of the first layer and/or larger than a thickness of the third layer.

In Example 13, the subject-matter of Example 12 may optionally include that the intermetallic phase forms between about 80% and about 95% by weight of the second layer.

In Example 14, the subject-matter of Example 13 may optionally include that the intermetallic phase consists of or essentially consists of $Ni_3Sn_4$ and/or $Ni_3Sn_2$.

In Example 15, the subject-matter of any of Examples 12 to 14 may optionally include that the second layer further includes further nickel particles having a size that is smaller than the size of the nickel particles.

In Example 16, the subject-matter of any of Examples 12 to 15 may optionally include that the first layer and/or the third layer includes, consists of, or essentially consists of at least one of a group including nickel, nickel vanadium (NiV), a nickel phosphide, e.g. NiP, nickel silicide (NiSi), copper, gold, silver, platinum, tin, zinc, and palladium.

In Example 17, the subject-matter of any of Examples 12 to 16 may optionally include that a thickness of the first layer and/or a thickness of the third layer is in a range from about 100 nm to about 5 µm.

In Example 18, the subject-matter of any of Examples 12 to 17 may optionally include that a thickness of the second layer is in a range from about 50 µm to about 70 µm.

Example 19 is a chip package. The chip package may include the layer structure of any of Examples 12 to 18, a chip including the first layer, a conductive substrate including the third layer, and an encapsulation at least partially encapsulating the chip and at least one of the first layer, the second layer, and the third layer.

Example 20 is a method of forming a layer structure, the method including arranging a layer of a solder material in accordance with any of Examples 1 to 11 between a first layer comprising nickel or a nickel alloy and a third layer comprising nickel or a nickel alloy, and heating the layer structure to a melting temperature of the solder material until an intermetallic phase forms.

In Example 21, the subject-matter of Example 20 may optionally include that the second layer includes nickel particles having a size that is larger than a thickness of the first layer and/or larger than a thickness of the third layer.

In Example 22, the subject-matter of Example 20 or 21 may optionally include that the intermetallic phase forms between about 80% and about 95% by weight of the second layer.

In Example 23, the subject-matter of any of Examples 20 to 22 may optionally include that the intermetallic phase consists of or essentially consists of $Ni_3Sn_4$ and/or $Ni_3Sn_2$.

In Example 24, the subject-matter of any of Examples 20 to 23 may optionally include that the second layer further includes further nickel particles having a size that is smaller than the size of the nickel particles.

In Example 25, the subject-matter of any of Examples 20 to 24 may optionally include that the first layer and/or the third layer includes, consists of, or essentially consists of at least one of a group including nickel, nickel vanadium (NiV), a nickel phosphide, e.g. NiP, nickel silicide (NiSi), copper, gold, silver, platinum, tin, zinc, and palladium.

In Example 26, the subject-matter of any of Examples 20 to 25 may optionally include that a thickness of the first layer and/or a thickness of the third layer is in a range from about 100 nm to about 5 μm.

In Example 27, the subject-matter of any of Examples 20 to 26 may optionally include that a thickness of the second layer is in a range from about 50 μm to about 70 μm.

Example 28 is a method of forming a chip package. The method may include forming the layer structure in accordance with any of Examples 20 to 27, wherein the first layer is a chip metallization layer, and wherein the second layer is part of a conductive substrate, and forming an encapsulation at least partially encapsulating the chip and the layer structure.

Example 29 is a layer structure. The layer structure may include a first layer including at least one or consisting of a material of a first group of materials, the first group including nickel, copper, gold, silver, palladium, tin, zinc, platinum, and an alloy of any of these materials, a third layer comprising at least one or consisting of a material of a second group of materials, the second group including nickel, copper, gold, palladium, tin, silver, zinc, platinum, and an alloy of any of these materials, and a second layer between the first layer and the third layer, wherein the second layer consists of or essentially consists of nickel and tin, wherein the second layer comprises an intermetallic phase of nickel and tin, and wherein, optionally, the second layer comprises nickel particles having a size that is larger than a thickness of the first layer and/or larger than a thickness of the third layer.

In Example 30, the subject-matter of Example 29 may optionally include that the intermetallic phase forms an interconnected structure.

In Example 31, the subject-matter of Example 19 may optionally include that the conductive substrate is a leadframe.

In Example 32, the subject-matter of Example 31 may optionally include that the third layer is a plating layer formed on the leadframe.

In Example 33, the subject-matter of Example 19, 31 or 32 may optionally include that the first layer is a plating layer formed on a chip metallization.

In Example 34, the subject-matter of any of Examples 19 or 31 to 33 may optionally include that the first layer and/or the third layer includes, consists of, or essentially consists of at least one of a group including nickel, nickel vanadium (NiV), a nickel phosphide, e.g. NiP, nickel silicide (NiSi), copper, gold, silver, tin, platinum, zinc, and palladium.

In Example 35, the subject-matter of any of Examples 19 or 31 to 34 may optionally include that a thickness of the first layer and/or a thickness of the third layer is in a range from about 100 nm to about 5 μm.

Example 36 is a chip arrangement. The chip arrangement may include a chip package including a chip and at least one metal lead for electrically contacting the chip from an outside of the package, a printed circuit board including at least one contact pad, and a layer between the at least one metal lead and the at least one contact pad, wherein the layer consists of or essentially consists of nickel and tin, wherein the layer includes an intermetallic phase of nickel and tin, and wherein, optionally, the layer includes nickel particles having a size that is larger than a thickness of the metal lead and/or larger than a thickness of the contact pad.

In Example 37, the subject-matter of Example 36 may optionally include that the at least one metal lead and the at least one contact pad respectively includes at least one or consists of a material of a group of materials, the group including nickel, copper, gold, platinum, palladium, tin, zinc, and an alloy of any of these materials.

In Example 38, the subject-matter of Example 36 or 37 may optionally include that the at least one metal lead and/or the at least one contact pad includes a plating layer.

In Example 39, the subject-matter of Example 38 may optionally include that the plating layer includes, consists of, or essentially consists of at least one of a group including nickel, nickel vanadium (NiV), nickel phosphide, e.g. NiP, and nickel silicide (NiSi), copper, gold, silver, platinum, tin, zinc, and palladium.

In Example 40, the subject-matter of Example 39 may optionally include that a thickness of the plating layer is in a range from about 100 nm to about 5 μm.

Example 41 is a method of forming a layer structure. The method may include arranging a layer of a solder material in accordance with any of Examples 1 to 11 between a first layer and a third layer, wherein the first layer and the third layer respectively includes at least one or consists of a material of a group of materials, the group including nickel, copper, gold, palladium, and an alloy of any of these materials, and heating the layer structure to a melting temperature of the solder material until an intermetallic phase forms.

In Example 42, the subject-matter of Example 40 may optionally further include forming the first layer and/or the third layer as a plating layer with at least one of a group including nickel vanadium (NiV), a nickel phosphide, e.g. NiP, nickel silicide (NiSi), copper, gold, silver, platinum, tin, silver, zinc, and palladium, and an alloy of any of these materials.

In Example 43, the subject-matter of Example 42 may optionally include that a melting temperature of the intermetallic phase is higher than a melting temperature of the solder material.

Example 44 is a method of forming a chip arrangement. The method may include arranging a layer of a solder material in accordance with any of Examples 1 to 11 between at least one metal lead of a chip package and a contact pad of a printed circuit board, and heating the solder material to a melting temperature of the solder material until an intermetallic phase forms.

In Example 45, the subject-matter of Example 44 may optionally include that a melting temperature of the intermetallic phase is higher, optionally at least 100K higher, than a melting temperature of the solder material.

In Example 46, the subject-matter of Example 44 or 45 may optionally further include soldering at least one additional circuit element onto the printed circuit board, thereby heating the intermetallic phase to a temperature above a melting temperature of the solder material, but below a melting temperature of the intermetallic phase. Example 47 is a solder material. The solder material may include nickel and tin, wherein the nickel may include a first amount of particles and a second amount of particles, wherein a sum of the first amount of particles and the second amount of particles is a total amount of the nickel or less, wherein the first amount of particles is between 5 at % and 60 at % (preferably between 25 at % and 60 at %) of the total amount of the nickel, wherein the second amount of particles is between 10 at % and 95 at % (preferably between 10 at % and 75 at %) of the total amount of the nickel, wherein the particles of the first amount of particles have a first size distribution, wherein the particles of the second amount of particles have a second size distribution, wherein 30% to 70% of the first amount of particles have a particle size that is in a range of about 5 µm around a particle size the highest number of particles have according to the first size distribution, and wherein 30% to 70% (optionally 40% to 60%) of the second amount of particles have a particle size that is in a range of about 5 µm around a particle size the highest number of particles have according to the second size distribution.

In Example 48, the subject matter of Example 47 may optionally include that the particles of the first amount of particles have a size in a range from about 0.5 µm to about 20 µm, and that the particles of the second amount of particles have a size in a range from about 30 µm to about 50 µm.

In Example 49, the subject matter of Example 47 or 48 may optionally include that the tin is part of a tin-rich material.

In Example 50, the subject matter of Example 49 may optionally include that the tin-rich material includes at least one material of a group of materials, the group including Sn, SnAg, SnAgCu, SnCu, SnSb, and a different tin-rich material that consists predominantly of Sn and is essentially free or free of lead.

In Example 51, the subject matter of any of Examples 47 to 50 may optionally include that the nickel includes a third amount of particles, wherein a sum of the first amount of particles, the second amount of particles, and the third amount of particles is a total amount of the nickel or less, that the third amount of particles is between 10 at % and 85 at % of the total amount of the nickel, that the particles of the third amount of particles have a third size distribution, wherein 30% to 70% (optionally 40% to 60%) of the third amount of particles have a particle size that is in a range of about 5 µm around a particle size the highest number of particles have according to the third size distribution.

In Example 52, the subject matter of Example 51 may optionally include that the particles of the third amount of particles have a size in a range from more than 20 µm to less than 30 µm.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A solder material, comprising:
   nickel; and
   tin;
   wherein the nickel comprises a first amount of particles and a second amount of particles,
   wherein a sum of the first amount of particles and the second amount of particles is a total amount of the nickel or less,
   wherein the first amount of particles is between 5 at % and 60 at % of the total amount of the nickel,
   wherein the second amount of particles is between 10 at % and 95 at % of the total amount of the nickel,
   wherein the particles of the first amount of particles have a first size distribution,
   wherein the particles of the second amount of particles have a second size distribution,
   wherein 30% to 70% of the first amount of particles have a particle size that is in a range of about 5 µm around a particle size the highest number of particles have according to the first size distribution,
   wherein 30% to 70% of the second amount of particles have a particle size that is in a range of about 5 µm around a particle size the highest number of particles have according to the second size distribution.

2. The solder material of claim 1, wherein 20% to 60% of the first amount of particles have a particle size that is in a range of about 5 µm around a particle size the highest number of particles have according to the first size distribution.

3. The solder material of claim 1, wherein 20% to 60% of the second amount of particles have a particle size that is in a range of about 5 µm around a particle size the highest number of particles have according to the second size distribution.

4. The solder material of claim 1, wherein the particles of the first amount of particles have a size in a range from about 0.5 µm to about 20 µm, and wherein the particles of the second amount of particles have a size in a range from about 30 µm to about 50 µm.

5. The solder material of claim 1, wherein the tin is part of a tin-rich material.

6. The solder material of claim 5, wherein the tin-rich material comprises at least one material selected from the group consisting of: Sn, SnAg, SnAgCu, SnCu, SnSb, and a different tin-rich material that consists predominantly of Sn and is essentially free of lead.

7. The solder material of claim 1, wherein the first amount of particles is between 25 at % and 60 at % of the total amount of the nickel, and wherein the second amount of particles is between 10 at % and 75 at % of the total amount of the nickel.

8. The solder material of claim 1, wherein the particles are spherical or essentially spherical.

9. The solder material of claim 1, wherein the nickel comprises a third amount of particles, wherein a sum of the first amount of particles, the second amount of particles, and the third amount of particles is a total amount of the nickel or less, wherein the third amount of particles is between 10 at % and 85 at % of the total amount of the nickel, and wherein the particles of the third amount of particles have a third size distribution.

10. The solder material of claim 9, wherein 30% to 70% of the third amount of particles have a particle size that is in a range of about 5 μm around a particle size the highest number of particles have according to the third size distribution.

11. The solder material of claim 9, wherein 40% to 60% of the third amount of particles have a particle size that is in a range of about 5 μm around a particle size the highest number of particles have according to the third size distribution.

12. The solder material of claim 9, wherein the particles of the third amount of particles have a size in a range from more than 20 μm to less than 30 μm.

13. The solder material of claim 1, wherein a nickel amount of the solder material is in a range from about 35 at % to about 90 at %.

14. The solder material of claim 1, wherein the solder material is a solder paste.

15. The solder material of claim 14, wherein the solder paste comprises a tin based soft solder, in which the first amount of particles and the second amount of particles are distributed.

16. The solder material of claim 1, wherein the solder material is a solder wire.

17. The solder material of claim 1, wherein the solder material is a compacted solder powder or a solder preform.

* * * * *